US011413760B2

(12) United States Patent
Paulson et al.

(10) Patent No.: US 11,413,760 B2
(45) Date of Patent: Aug. 16, 2022

(54) FLEX-RIGID SENSOR ARRAY STRUCTURE FOR ROBOTIC SYSTEMS

(71) Applicant: Robotik Innovations, Inc., Palo Alto, CA (US)

(72) Inventors: Christopher A. Paulson, Redwood City, CA (US); Clinton J. Smith, San Francisco, CA (US); Christopher Lalau Keraly, San Francisco, CA (US); Matthew E. Shaffer, Menlo Park, CA (US); Bernard D. Casse, Saratoga, CA (US)

(73) Assignee: RIOA Intelligent Machines, Inc., Menlo Park, CA (US)

( * ) Notice: Subject to any disclaimer, the term of this patent is extended or adjusted under 35 U.S.C. 154(b) by 351 days.

(21) Appl. No.: 16/832,755

(22) Filed: Mar. 27, 2020

(65) Prior Publication Data

US 2020/0306979 A1    Oct. 1, 2020

Related U.S. Application Data

(60) Provisional application No. 62/826,787, filed on Mar. 29, 2019, provisional application No. 62/826,834, filed on Mar. 29, 2019.

(51) Int. Cl.
*B25J 9/16* (2006.01)
*G01L 1/16* (2006.01)
(Continued)

(52) U.S. Cl.
CPC .............. *B25J 9/1694* (2013.01); *G01D 5/24* (2013.01); *G01H 11/08* (2013.01); *G01K 7/16* (2013.01);
(Continued)

(58) Field of Classification Search
CPC ......... B25J 9/1694; G01D 5/24; G01H 11/08; G01K 7/16; G01L 1/146; G01L 1/16; G01L 1/18; G01L 1/22
(Continued)

(56) References Cited

U.S. PATENT DOCUMENTS

2004/0246681 A1   12/2004   Belady et al.
2007/0164446 A1   7/2007   Hawk, Jr. et al.
(Continued)

FOREIGN PATENT DOCUMENTS

KR         20090029091 A   *   3/2009

*Primary Examiner* — Octavia Davis Hollington
(74) *Attorney, Agent, or Firm* — Bever, Hoffman & Harms, LLP

(57) ABSTRACT

A flex-rigid sensor apparatus for providing sensor data from sensors disposed on an end-effector/gripper to the control circuit of an arm-type robotic system. The apparatus includes piezo-type pressure sensors sandwiched between lower and upper PCB stack-up structures respectively fabricated using rigid PCB (e.g., FR-4) and flexible PCB (e.g., polyimide) manufacturing processes. Additional (e.g., temperature and proximity) sensors are mounted on the upper/flexible stack-up structure. A spacer structure is disposed between the two stack-up structures and includes an insulating material layer defining openings that accommodate the pressure sensors. Copper film layers are configured to provide Faraday cages around each pressure sensor. The pressure sensors, additional sensors and Faraday cages are connected to sensor data processing and control circuitry (e.g., analog-to-digital converter circuits) by way of signal traces formed in the lower and upper stack-up structures and in the spacer structure. An encapsulation layer is formed on the upper PCB stack-up structure.

20 Claims, 10 Drawing Sheets

(51) Int. Cl.
  *G01L 1/18*  (2006.01)
  *G01D 5/24*  (2006.01)
  *G01L 1/14*  (2006.01)
  *G01H 11/08* (2006.01)
  *G01K 7/16*  (2006.01)
  *G01L 1/22*  (2006.01)

(52) U.S. Cl.
  CPC ............... *G01L 1/146* (2013.01); *G01L 1/16* (2013.01); *G01L 1/18* (2013.01); *G01L 1/22* (2013.01)

(58) Field of Classification Search
  USPC ........................................................ 700/258
  See application file for complete search history.

(56) References Cited

U.S. PATENT DOCUMENTS

| | | | |
|---|---|---|---|
| 2008/0296057 A1 | 12/2008 | Dudnikov, Jr. | |
| 2013/0238129 A1* | 9/2013 | Rose | B25J 19/0029 |
| | | | 700/258 |
| 2014/0227833 A1 | 8/2014 | Arnold et al. | |
| 2020/0094412 A1* | 3/2020 | Casse | G01L 5/226 |
| 2020/0306986 A1* | 10/2020 | Keraly | B25J 15/02 |
| 2020/0306993 A1* | 10/2020 | Smith | B25J 9/0009 |

\* cited by examiner

FLEX-RIGID SENSOR ARRAY STRUCTURE FOR ROBOTIC SYSTEMS

RELATED APPLICATION

This application claims priority from U.S. Provisional Patent Application No. 62/826,787, entitled "Flex Rigid Sensor Array Stackup", filed on Mar. 29, 2019, and from U.S. Provisional Patent Application No. 62/826,834, entitled "Out of Plane Circuitry for Piezoelectric Tactile Sensors", filed on Mar. 29, 2019.

FIELD OF THE INVENTION

This invention relates generally to robotic systems and more particularly to end-effector sensors for arm-type robot mechanisms.

BACKGROUND OF THE INVENTION

Most modern robotic systems integrate mechanical, electrical/electronic and computer science technologies to provide autonomously controlled mechanisms capable of performing a variety of programmed operations (tasks). For example, articulated robots are a class of industrial robotic systems in which a control circuit converts user-provided software-based instructions into motor control signals that control a robot arm mechanism and attached end effector (e.g., a hand or gripper) to perform repetitive tasks, such as moving target objects from one location to another location. To perform such programmed operations, the software-based instructions provided to most articulated robots must specify three-dimensional (3D) coordinates of the starting location at which the target objects are located for pick-up, a designated 3D travel path through which the target objects may be moved without interference, and 3D coordinates defining the terminal location (e.g., a receptacle or support surface) at which the target objects are to be placed. When suitable software-based instructions are provided, the control circuit generates a corresponding series of motor control signals that cause the robot arm mechanism to move the end effector to the initial/starting location coordinates, then cause the end effector to close on (grasp) the target object, then cause the robot arm mechanism to lift/move the target object to the terminal location coordinates along the designated travel path, and then cause the end effector to open/release the target object.

Most conventional robotic systems utilize no sensing architecture, and those that do utilize single-modality sensing architectures. Conventional robotic systems that utilize no sensing architecture rely entirely on pre-programmed commands, and typically fail to adjust for minor positional variations to unanticipated environmental variations. In contrast, single-modality sensing architectures provide feedback information to a host robotic system's control circuit, thereby allowing the control circuit to modify user-provided program instructions in order to accommodate minor positional variations (i.e., relative to program-based coordinates). That is, although the above-described programmed operation approach may be solely used in highly ordered environments, most practical operating environments include random positional variances and other unanticipated events that can cause erroneous operations and possibly dangerous situations. For example, the inadvertent displacement of a target object away from its designated starting location coordinates may prevent successfully grasping by the end effector, and in some cases may result in damage to the target object and/or end effector/gripper (e.g., due to off-center contact between the end effector and the target object during the grasping operation). To avoid such incidents, modern robotic systems often employ single-modal sensing architectures (e.g., one or more force sensors disposed on the end effector) and/or camera systems that are configured to provide feedback information that allows the system's control circuit to recognize and adjust the programmed operation to accommodate minor variations. For example, a single-modal sensor disposed on an end effector may provide feedback information indicating the displacement of a target object away from the designated starting location coordinates (e.g., by way of unexpected contact with the target object during a grasping operation)—this feedback information may be utilized by the control circuit to adjust the robot arm mechanism such that the end effector is repositioned in a way that allows successful grasping of the displaced target object.

The lack of a rich end effector sensory feedback is one of the main limitations of modern robotic systems. That is, although single-modality sensing architectures may be used to prevent some industrial accidents, conventional single-modality sensors are currently unable to provide enough feedback information to allow a robotic system to perform complex assembly processes. For example, although single-modality pressure sensor arrangements may provide sufficient data to verify that a predetermined gripping force is being applied by an end effector onto a target object, such pressure sensors lack the rich sensor feedback needed to recognize when the target object is slipping from the end effector's grasp, and therefore are unable to avoid the resulting accident damage to the target object. In addition, when performing assembly tasks such as mounting a canister-type object over a cylindrical object, single-modality pressure sensor arrangements provide insufficient data regarding excessive contact between the cannister and cylindrical objects when the canister and cylindrical objects are misaligned. Note that while camera-type feedback systems may be useful to identify and adjust for such occurrences in some cases, critical portions of the camera's field of view are often occluded by the end effector, which limits the functionality of camera-type feedback systems. The image processing and inference times associated with camera-based techniques can also be too long to enable reflex-like adjustments to avoid inflicting damage. In contrast to single-modality sensors, the human hand consists of an unparalleled multimodal sensory system (i.e., mechanoreceptors sensing both pressure and vibration, and thermoreceptors sensing temperature), which largely contributes to its unprecedented dexterous manipulation. Specifically, the human multimodal sensing architecture provides fine-grained cues about contact forces, textures, local shape around contact points, and deformability, all of which are critical for evaluating an ongoing grasping operation, and to trigger force correction measures in case of instability.

What is needed is a sensing apparatus for robotic systems that overcomes the deficiencies of conventional single-modality sensor arrangements. In particular, what is needed is a low-cost sensing architecture that provides robotic end effectors with multi-modal tactile perception capabilities that facilitate enhanced human-like target object recognition and associated object manipulation control.

SUMMARY OF THE INVENTION

The present invention is directed to a flex-rigid sensor apparatus that is configured for use on an end effector (e.g., a gripper) of a robotic system, and utilizes a variety of sensors to collect tactile sensor data from surface features of a target object, thereby providing the robotic system's control circuit with multi-modal tactile perception capabilities that facilitate enhanced human-like target object recognition and associated object manipulation control. According to an aspect of the invention, the tactile sensor data is collected by multiple sensors mounted on a novel two-part rigid/flex PCB base structure including a (first) lower rigid printed circuit board (PCB) stack-up structure and an upper (second) flexible PCB stack-up structure. The lower/rigid PCB stack-up structure includes multiple layers of a rigid insulating material (e.g., FR-4) having patterned signal paths (e.g., copper traces and vias) formed thereon using an established rigid PCB manufacturing process, and the upper/flex PCB stack-up structure includes multiple layers of a flexible insulating material (e.g., polyimide) having patterned signal paths patterned thereon using an established flexible PCB manufacturing process. When the upper stack-up structure is mounted onto the lower stack-up structure during assembly, electrical connections are provided between contacts formed on the opposing interfacing surfaces facilitate the transmission of signals between input/output (I/O) pads formed on the lower/rigid PCB stack-up structure and contact structures (e.g., electrodes and/or pads) formed on the upper/flex PCB stack-up structure by way of associated signal paths formed on the two PCB stack-up structures. An advantage provided by the flex-on-rigid stack-up sensing architecture is the ability to facilitate the collection of sensor data from sensors disposed in at least two layers/planes by way of disposing first sensors in a first layer on an upper surface of the lower/rigid stack-up structure (i.e., between the two PCB stack-up structures), and disposing second sensors in a second layer on an upper surface of the upper/flex PCB stack-up structure). Moreover, because established low-cost PCB fabrication processes may be utilized to generate both the lower/rigid PCB stack-up structure and the upper/flex PCB stack-up structure, the flex-rigid sensor apparatus may be produced at a low cost and with a high production yield.

According to an embodiment of the invention, the flex-rigid sensor apparatus includes an array of pressure sensors sandwiched between the lower/rigid and upper/flex PCB stack-up structures such that each pressure sensor is electrically connected between an associated lower (first) electrode disposed on the lower/rigid PCB stack-up structure and an associated upper (second) electrode disposed on the upper/flex stack-up structure. That is, opposing pairs of electrodes are respectively patterned on opposing (upper and lower) surfaces of the two PCB stack-up structures such that, during assembly, the pressure sensors are sandwiched between associated electrode pairs when the upper/flex PCB stack-up structure is mounted and operably connected (e.g., by way of reflow soldering) to the lower/rigid PCB stack-up structure. Additional connections are also provided between the signal paths of the two PCB stack-up structures (e.g., by way of metal vias provided on an optional spacer structure) to facilitate the transmission of signals to and from the upper pressure electrodes, and to also provide signal connections to additional sensors disposed on the upper surface of the upper/flex PCB stack-up structure. An additional advantage provided by this upper/lower electrode configuration is that it facilitates the use of low-cost, highly sensitive, high bandwidth and robust piezo-type (i.e., piezoelectric or piezoresistive) pressure sensors by orienting the poling direction of piezo-type sensor structures in a normal direction (i.e., perpendicular to the planes defined by the stack-up structures), whereby a voltage potential or resistance between the upper and lower electrodes is proportional to the amount of pressure force applied in the normal direction. In less-preferred embodiments, the pressure sensors may be implemented using strain gauge sensors, capacitive pressure sensors, or cavity-based pressure sensors. In addition, by sandwiching the pressure sensor array between rigid and flex stack-up structures, the rigid PCB material of the lower/rigid PCB stack-up structure provides a fixed (unyielding) base while the flexible PCB material of the upper/flex stack-up structure facilitates the collection of independent pressure sensor data from multiple spaced-apart pressure sensors (i.e., a point-type pressure force applied to a region of the upper/flex stack-up structure is transmitted substantially vertically to one or a small number of pressure sensors located below the region, and local deformation of the flexible PCB material substantially dampens the transference of pressure force to pressure sensors located away from the contacted region). With this arrangement, regions of the upper/flexible stack-up structure contacted by protruding surface features of the target object are pressed into underlying pressure sensors, thereby causing these underlying pressure sensors to generate relatively high contact pressure sensor data values, and regions of the upper/flexible stack-up structure that are not contacted by the target object remain relatively uncompressed, whereby the pressure sensors disposed under these uncompressed regions generate relatively low contact pressure sensor data values. Moreover, this arrangement facilitates forming the pressure sensor array with any number of pressure sensors arranged in a symmetric arrangement separated by a wide range of spacing distances between adjacent sensors without requiring changes to the arrangement of additional sensors (e.g., temperature sensors, proximity sensors and/or vibration sensors) disposed on the upper surface of the upper/flex PCB stack-up structure, thereby facilitating human-type pressure sensing capabilities by minimizing the distribution of the point-type pressure force to pressure sensors located away from the contacted region). That is, by providing a pressure sensor array including multiple closely-spaced pressure sensors, the flex-rigid sensor apparatus facilitates the generation of area-based pressure sensor data suitable for determining desired information regarding the target object (e.g., details regarding the target object's surface features and/or the target object's position and orientation relative to the robotic system's contact structure).

According to an embodiment of the invention, the flex-rigid sensor apparatus includes the lower/rigid and upper/flexible PCB stack-up structures, the two sensor layers rigidly disposed on upper surfaces of the two PCB stack-up structures, and sensor control and data processing circuitry operably coupled to input/output pads disposed on the lower surface of the lower/rigid PCB stack-up structure. In a preferred embodiment, the two sensor layers include a pressure sensor array disposed between the two PCB stack-up structures, and additional sensors (e.g., temperature sensors, proximity sensors and/or vibration sensors) disposed on top of the upper/flex PCB stack-up structure. The sensor control and data processing circuit(s) is/are configured to control sensor operations (e.g., pressure measurement operations of the pressure sensor array) by way of transmitting operating voltages or other control signals to selected input pads and reading resulting sensor data signals from associated output pads. In alternative practical embodiments, the sensor control and data processing circuitry is either connected directly to the input/output pads (e.g., by way of solder-based connecting structures), or coupled to the input/ output pads by way of an intervening mezzanine connector. In either case the sensor control and data processing circuitry transmits control signals along control signal paths to one terminal of each sensor and receives corresponding sensor data signals passed along data signal paths from the other terminal of each pressure sensor. In an exemplary embodiment, the sensor control and data processing circuitry includes analog-to-digital circuitry configured to convert analog sensor data signals received from the various sensors into corresponding digital values, digital processing circuitry that generates tactile information in response to the corresponding digital values, and transceiver circuitry configured to transmit the tactile information to the host robotic system's control circuit.

According to another embodiment of the present invention, a simplified assembly and solder reflow method is implemented to produce the above-mentioned flex-rigid sensor apparatus are produced using that further reduces total fabrication costs. First, the lower/rigid stack-up structure is produced using conventional rigid electrically-insulating PCB fabrication techniques (i.e., such that the lower/rigid stack-up structure includes a laminated stack of rigid insulating material layers/substrates having a patterned conductive (e.g., copper) film formed thereon), and the upper/flexible stack-up structure is separately produced using conventional flexible (flex) PCB fabrication techniques (i.e., such that the upper/flexible stack-up structure includes one or more flexible insulating material layers/substrates having associated patterned conductive films/layers). In alternative embodiments the lower/rigid stack-up structure is fabricated using as a rigid insulating material either a glass-epoxy material (e.g., FR-4), ceramic (e.g., ceramic substrate or ceramics-filled PTFE), plastic (e.g., Bakelite) or insulated metal (e.g., an aluminum clad with thermally conductive dielectric), and the upper/flexible stack-up structure is fabricated using a flexible insulating material such as polyimide or polyethylene terephthalate (PET). To facilitate implementation of the vertically oriented piezoelectric-type pressure sensors, the conductive film formed on the uppermost surface of the lower/rigid stack-up structure is patterned to include an array of lower (first) pressure sensor electrodes, and the lowermost surface of the upper/flexible stack-up structure is patterned to include a corresponding array of upper (second) pressure sensor electrodes. With the stack-up structures formed in this manner, assembly of the pressure sensor array is performed by depositing solder paste portions on the lower and upper pressure sensor electrodes, then mounting the piezo-type pressure sensors on the lower/rigid stack-up structure (i.e., on the solder paste portion disposed over each lower pressure sensor electrodes) and mounting the upper/flexible stack-up structure over the lower/rigid stack-up structure (i.e., such that solder paste portion disposed on each upper pressure sensor electrode contacts the upper surface of an associated piezoelectric-type pressure sensor), and then performing a reflow soldering process to secure (electrically connect) the piezo-type pressure sensors to both the lower pressure sensor electrodes and the upper pressure sensor electrodes). The lower/rigid stack-up structure and the upper/flexible stack-up structure are also formed with patterned metal traces and via structures that collectively form signal paths extending between each pressure sensor electrode and a corresponding input/output (I/O) pad disposed on the lower/rigid stack-up structure's lowermost surface. In one embodiment, one or more sensor control and data processing circuits are simultaneously electrically connected to the I/O pads (e.g., during the reflow soldering process mentioned above), and an optional encapsulating layer is formed over the additional sensors after the solder reflow process is completed. This preferred configuration facilitates the inexpensive production of reliable and durable flex-rigid sensor apparatuses capable of performing the tactile exploration of a target object described above.

In some embodiments the apparatus is formed with a skin-like encapsulating layer that is disposed on an uppermost surface of second PCB structure. In some embodiments the encapsulating layer consists essentially of a durable flexible material (e.g., silicone rubber) that provides suitable friction for grasping and holding target objects, and serves to protect the additional sensors and underlying pressure sensor array by way of acting as a thermal insulator and a shock absorber (i.e., by elastically deforming in response to contact forces applied by target objects during operation interactions). In a presently preferred embodiment, the encapsulating layer is implemented using a layer of silicone rubber having a thickness in the range of 0.5 mm to 10 mm and a material formulation characterized by having surface roughness from 0 to 300 microns RMS and a durometer of 30 A to 70 A. This specific silicone layer formulation and configuration facilitates utilizing the encapsulating layer as a speaker-like medium that transmits a high/low pressure wave front in response to slipping-type displacement of a target object when otherwise grasped by a robotic gripper. By forming the encapsulating layer using silicone having the specifications mentioned above, slipping displacement in a lateral direction relative to the encapsulating layer (i.e., parallel to pressure sensor array) causes the silicone layer's surface generate a high/low alternating pressure wave front that can be easily detected as vibration force components by the pressure sensors (or by other vibration sensors mounted on the apparatus). Accordingly, by configuring the apparatus to generate sensor data that indicates the start of a slipping process in response to detection of the vibration force components, the apparatus facilitates immediate corrective action by the host robotic system's control circuit (e.g., increasing the applied gripping force) to preventing further slipping and avoid damage to the target object.

According to another embodiment, the flexible-rigid sensor apparatus includes sensor control and data processing circuitry that is operably coupled (e.g., directly connected by way of solder-based connections or by way of a mezzanine connector or other circuit structure) to the input/output pads disposed on the lower surface of the lower/rigid PCB stack-up structure, and is configured to receive sensor data from the apparatus' sensors by way of associated signal paths. For example, pressure sensor data generated by a given pressure sensor is transmitted along an associated (first) signal path disposed in the lower/rigid PCB stack-up structure and through an associated input/output pads to an associated input terminal of the sensor control and data processing circuitry. Similarly, temperature or other sensor data is transmitted from a given additional sensor along an associated (second) path disposed in the upper/flex PCB stack-up structure, then along an associated additional sensor via disposed in the spacer structure, then along an associated (first) signal path disposed in the lower/rigid PCB stack-up structure to an associated input/output pads. Sensor control and data processing circuitry is thus operably coupled to receive multimodal (i.e., pressure and additional) sensor data from each sensor mounted on the apparatus by way of corresponding input/output pads. In one embodiment, sensor control and data processing circuitry includes an analog-to-digital converter (ADC) circuit that is operably configured to convert analog sensor data values received from the various sensors into corresponding digital sensor values, a sensor data processing circuit configured to generate tactile information in response to the digital pressure sensor values, and transceiver circuitry configured to transmit the tactile information to the robotic system's control circuit (i.e., by way of a USB or other serial data bus). In one embodiment, the sensor control and data processing circuitry is entirely directly connected by way of solder-based connections to the input/output pads disposed on the lower surface of the lower/rigid PCB stack-up structure. In an alternative embodiment, a first portion of the sensor control and data processing circuitry (e.g., including the ADC circuitry) is disposed on a first PCB structure that is directly connected to the lower/rigid PCB stack-up structure, and a second portion of the sensor control and data processing circuitry (e.g., including the sensor data processing circuit and transceiver circuitry) is disposed on a separate PCB structure that is operably coupled to the first portion by way of one or more mezzanine connectors (or other circuit structure) to receive digital sensor values in a serial data transmission from the ADC circuitry. This approach facilitates protecting the sensor data processing circuit and transceiver circuitry from damage that may be caused by pressure forces generated by contact between the apparatus and target objects, and facilitates a wide range of pressure sensor configurations (e.g., high resolution sensor arrays including a relatively large number of densely packed pressure sensors, or low resolution arrays including a relatively small number of pressure sensors) by facilitating the use of a single mezzanine connector capable of supporting all pressure sensor configurations. Various additional features are optionally implemented to further enhance the beneficial aspects of the invention. For example, two or more ADC circuits may be utilized to more efficiently accommodate different sensor types, and an optional sensor controller may be included to facilitate different sensing modes (e.g., static versus vibration measurements by the pressure sensor array). The tactile information generation process performed by the sensor data processing circuit may be enhanced by way of utilizing a programmable logic device (e.g., a field-programmable gate array (FPGA) a programmable-system-on-chip (PSOC) circuit, and efficient transmission of the tactile information may be accomplished using a Universal Serial Bus (USB) transceiver circuit.

According to a practical embodiment of the present invention, a robotic system implements two or more rigid/flex sensor apparatus on associated contact structures of opposing end effector (gripper) fingers. In one embodiment each rigid/flex sensor apparatus includes an associated sensor control and data processing circuitry, whereby each apparatus generates and transmits tactile information along one or more serial (e.g., USB) data buses that extend along the robot (arm) mechanism between the end effector and the control circuit. In other embodiments analog multimodal sensor data generated by the sensors of two or more rigid/flex sensor apparatus disposed on a single end effector/gripper may be converted into digital sensor data using ADC circuitry disposed on each apparatus, and then the digital sensor data may be collectively processed by a shared sensor data processing circuit, whereby the tactile information transmitted to the robot system's control circuit is generated in response to sensor data collected by multiple apparatuses. In one embodiment, the tactile information generated by one or both rigid/flex sensor apparatus is provided to a local gripper control circuit (actuator) mounted on the gripper to facilitate minimum-delay operations (e.g., increasing applied grasping force when object slipping is detected).

According to another embodiment of the present invention, a method for controlling a robotic system involves utilizing one or more rigid/flex sensor apparatus described above to generate tactile information in response to contact forces applied by a target object to corresponding contact structures of an end effector while grasping (or otherwise operably interacting with) the target object. The tactile information generated by the rigid/flex sensor apparatus is provided to the robotic system's control circuit, and optionally provided to a local gripper control circuit (actuator) mounted on the gripper to facilitate minimum-delay operations (e.g., increasing applied grasping force when object slipping is detected).

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to a rigid/flex sensor apparatus (i.e., a target object sensing architecture) that greatly enhances the capabilities of robotic systems. The following description is presented to enable one of ordinary skill in the art to make and use the invention as provided in the context of a particular application and its requirements. As used herein, directional terms such as "upper", "lower", "lower", "horizontal", "vertical", "front" and "back", are intended to provide relative positions for purposes of description and are not intended to designate an absolute frame of reference.

With reference to electrical connections between circuit elements, the terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the embodiments shown and described below, and the appended claims are accorded the widest scope consistent with the principles and novel features herein disclosed.

Figure 1:
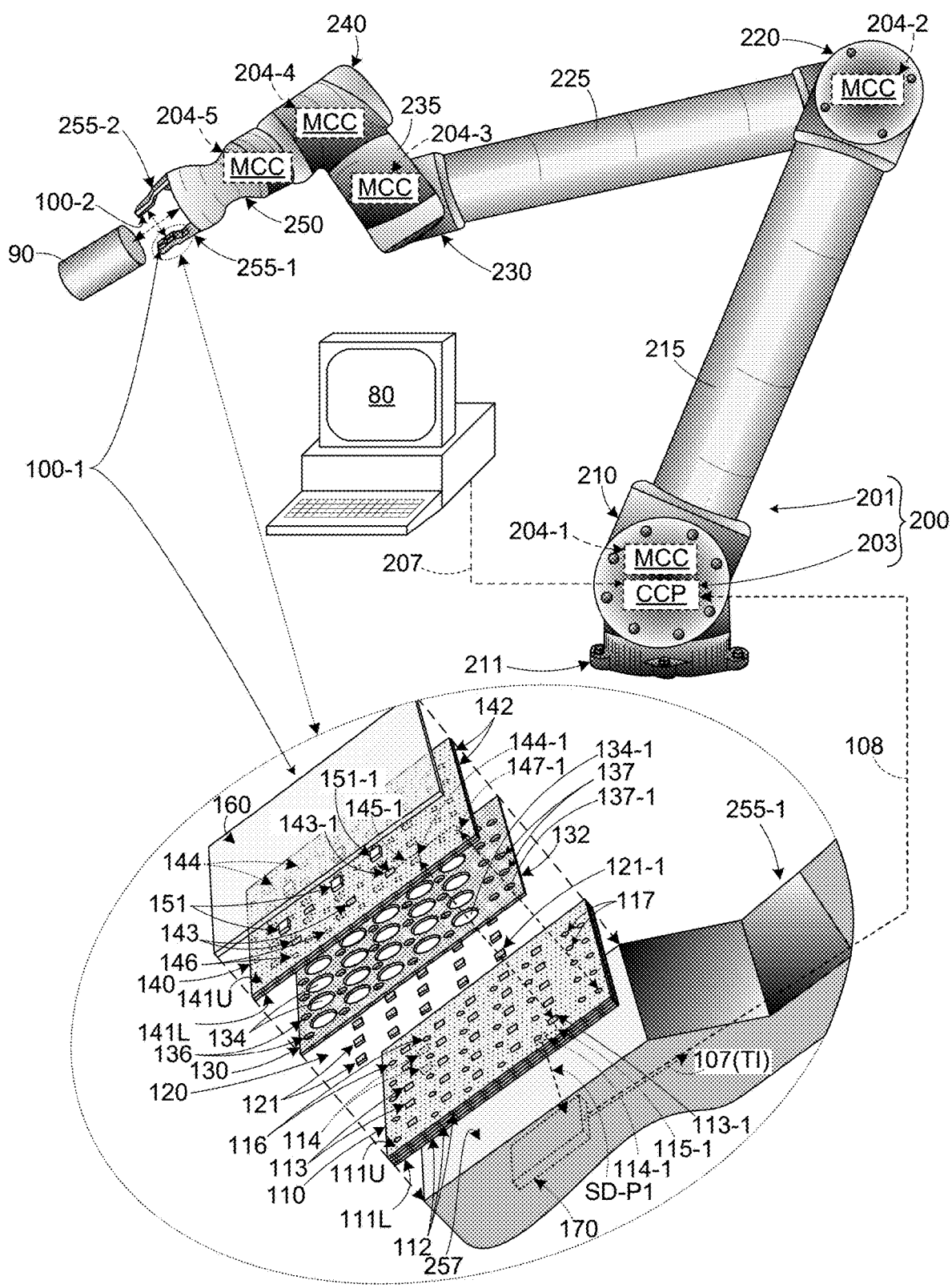
FIG. 1 is a diagram depicting a rigid/flex sensor apparatus implemented on an end-effector of an arm-type robotic system according to an embodiment of the present invention.

FIG. 1 shows an exemplary robotic system 200 that is provided to illustrate the use of novel rigid/flex sensor apparatuses 100-1 and 100-2 according to a generalized embodiment of the present invention. Exemplary robot system 200 is an arm-type robotic system generally including a robot arm-type mechanism 201 and a control circuit (CC) 203 (e.g., a microprocessor). As explained in detail below, novel rigid/flex sensor apparatuses 100-1 and 100-2 are configured for use on respective finger structures 255-1 and 255-2 of a two-fingered gripper mechanism (end effector) 250 that is mounted on a distal end of arm-type mechanism 201, where each novel rigid/flex sensor apparatus utilizes multi-modal sensors to collect sensor data corresponding to surface features of a target object 90 when robotic system 200 causes apparatuses 100-1 and 100-2 to operably interact with target object 90 (e.g., when arm-type mechanism 203 is actuated such that gripper 250 is moved into a position that allows finger structures 255-1 and 255-2 to securely grasp target object 90 during lifting, moving and placing operations in accordance with control signals generated by control circuit 203). As also described below, the sensor data collected by the various sensors of each apparatus 100-1 and 100-2 is utilized to generate multimodal tactile information (e.g., by circuitry provided on the rigid/flex sensor apparatus or separate data processing circuitry) which is fed-back to control circuit 203 to provide robotic system 200 with multi-modal tactile perception capabilities that facilitate enhanced human-like target object recognition and associated object manipulation control.

Referring to the upper right portion of FIG. 1, robot mechanism 201 includes various mechanisms and structures that are operably configured in accordance with known techniques and controlled to manipulate a target object 90 by way of various actuators. In the exemplary embodiment robot mechanism 201 includes a shoulder/base mechanism 210 configured for fixed attachment to a work surface (not shown) by way of a fixed base 211, an upper arm structure 215 extending from the shoulder/base mechanism 210 to an elbow mechanism 220, a forearm structure 225 extending from the elbow mechanism 220 to a wrist mechanism 230, a wrist structure 235 extending from the wrist mechanism 230 to hand/axial rotation mechanism 240, and gripper (end effector) 250 operably connected to a terminal portion of the hand/axial rotation mechanism 240. Gripper 250 is disposed at a distal end of robot arm mechanism 201 and includes two gripper fingers 255-1 and 255-2 configured to open (move away from each other) or close (move toward each other) in accordance with control signals generated by control circuit 203. Robot mechanism 201 also includes multiple actuators, each actuator including a motor control circuit (MCC) configured to actuate one or more associated electric motors (not shown) in response to control signals received from control circuit 203. For example, motor control circuit (MCC) 204-1 and associated first motor(s) form a first actuator disposed in shoulder-base mechanism 210 to facilitate selective rotation and pivoting of upper arm structure 215 relative to fixed base 211, a second actuator including MMC 204-2 is disposed in elbow mechanism 220 to facilitate selective pivoting of forearm structure 225 relative to upper arm structure 215, a third actuator including MMC 204-3 is disposed in wrist mechanism 230 to facilitate selective pivoting of wrist structure 235 relative to forearm structure 225, a fourth actuator including MMC 204-4 is disposed in hand axial rotation mechanism 240 to facilitate selective pivoting of gripper 250 relative to wrist structure 235, and a fifth actuator including MMC 204-5 disposed in end effector 250 that controls opening/closing of gripper fingers 255-1 and 255-2 relative to gripper 250. As mentioned above, robot mechanism 201 is merely introduced to provide a simplified context for explaining the features and benefits of the present invention, and the specific configuration of robot mechanism 201 is not intended to limit the appended claims. For example, although end-effector 250 is depicted as a two-fingered gripper, gripper/end-effector 250 may also be implemented using a probe (i.e., having a single finger-like structure) implementing one flexible-rigid sensor apparatus, or a gripper mechanism having three or more fingers with a flexible-rigid sensor apparatus mounted on each finger.

Control circuit 203 is configured to generate sequences of primary control signals that are transmitted via signal lines (not shown) to the various motor control circuits 204-1 to 204-5 during each user-designated operation. That is, control circuit 203 generates the primary control signal sequence in accordance with user-provided instructions 207, which are transmitted to control circuit 203 from a programming device 80 (e.g., a personal computer or workstation) and specify associated tasks to be performed by robot mechanism 201. The primary control signal sequences thus control mechanical reconfigurations of arm-type mechanism 201 by actuating (turning on/off) the various actuators of arm-type mechanism 201, whereby control circuit 203 causes gripper 250 to operably interact with target object 90. For example, to perform an operable interaction involving controlling gripper 250 to grasp target object 90, a control signal generator of control circuit 203 processes corresponding user-provided instructions 207 and generates/transmits first control signals to MCC 204-5 that cause the actuator disposed in end-effector 250 to increase a gap between gripper fingers 255-1 and 255-2 in accordance with an "open gripper" control instruction, then generates/transmits second control signals to MCCs 204-1 to 204-4 that cause upper the actuators disposed in arm structure 215, forearm structure 225, wrist structure 235 and axial rotation mechanism 240 to position end-effector 250 at designated X-Y-Z location coordinates such that gripper fingers 255-1 and 255-2 are disposed on opposite sides of target object 90, and then generates/transmits third control signals to MCC 204-5 that causes end-effector 250 to decrease the gap between gripper fingers 255-1 and 255-2 and to apply a grasping force onto target object 90 (i.e., such that gripper fingers 255-1 and 255-2 apply opposing contact forces against opposite sides of target object 90 in response to the "close gripper" control instruction).

In addition to performing primary control signal sequences (i.e., operations performed in accordance with user-provided instructions 207), control circuit 203 is also configured to generate secondary control signals that are inserted into (interrupt) the primary control signal sequence when feedback data 107 indicates an interrupt condition (e.g., a condition requiring an unscheduled termination of operations, or insertion of additional operations into the primary control signal sequence, or modification of one or more operations included in the primary control signal sequence). That is, control circuit 203 generates secondary control signals that cause robot mechanism 201 to execute pre-defined interrupt actions when feedback data 107 indicates the detection of corresponding predefined environmental conditions. That is, during operation of robotic system 200 to perform a specific task, control circuit 203 controls robot mechanism 201 by way of generating primary control signals as a default, and only interrupts the primary control signal sequence when an interrupt condition is indicated by feedback data 107. In one embodiment of the present invention, robotic system 200 is configured such that feedback data 107 includes tactile information TI generated in accordance with the sensor data collected by rigid/flex sensor apparatuses 100-1 and 100-2, and control circuit 203 is configured to generate secondary control signals in response to interrupt conditions indicated by tactile information TI. For example, when tactile information TI included in feedback data 107 indicates target object 90 is offset from the expected X-Y-Z location, control circuit 203 is configured to modify or replace a portion of the primary control signal sequence to adjust the position of gripper 250 such that it performs a grasping operation at an offset X-Y-Z location in accordance with associated secondary control signals (i.e., instead of performing the grasping operation at the original X-Y-Z location defined by the primary control signals). As described below, tactile information TI suitable for implementing such interrupt operations is produced in accordance with the sensor data generated by apparatuses 100-1 and 100-2.

Referring to gripper 250 in FIG. 1, two rigid/flex sensor apparatuses 100-1 and 100-2 are respectively fixedly attached to opposing contact surfaces of gripper fingers 255-1 and 255-2 such that apparatuses 100-1 and 100-2 face target object 90 during operable interactions (i.e., such that apparatuses 100-1 and 100-2 are pinched between gripper fingers 255-1 and 255-2, respectively, and corresponding surface portions of target object 90 when gripper 250 is actuated to grip target object 90). Each apparatus 100-1 and 100-2 is configured to provide sensor data that is utilized to generate tactile information TI, which forms at least a part of feedback information/data 107 provided to control circuit 203 on data bus 108 during operable interactions (i.e., apparatus 100-2 includes all features and details of apparatus 100-1 described below). In alternative embodiments only one rigid/flex sensor apparatus may be used (i.e., either apparatus 100-1 or apparatus 100-2), or more than two apparatuses may be used (e.g., in the case of a gripper including three or more fingers).

Referring to the dash-line bubble indicated at the lower portion of FIG. 1, in an exemplary embodiment rigid/flex sensor apparatus 100-1 is configured for fixed connection to gripper finger 255-1 (e.g., by way of fixed attachment to a gripper finger support surface 257), and generally includes a lower/rigid (first) printed circuit board (PCB) stack-up structure 110, a lower sensor array/layer 120, a spacer structure 130, an upper/flex (second) PCB stack-up structure 140, an upper sensor array/layer 150, an optional encapsulating layer 160, and optional sensor control and data processing circuitry 170. The following detailed description is primarily directed to the various structures, layers and sensors of apparatus 100-1, and that details regarding how rigid/flex sensor apparatus 100-1 may be configured for fixed connection to gripper finger 255-1 are omitted for brevity—in one embodiment the fixed connection may be implemented using techniques described in co-owned and co-filed U.S. patent application Ser. No. 16/832,690 entitled "TACTILE PERCEPTION APPARATUS FOR ROBOTIC SYSTEMS", which is incorporated herein by reference in its entirety. Apparatus 100-2 includes the structures and configuration described below with reference to perception apparatus 100-1.

Lower/rigid PCB stack-up 110 is microfabricated on a rigid PCB platform using standard rigid PCB fabrication and assembly processes, and primarily functions both as a structural base and also as a multi-layered medium for routing densely packed signals which are subject to electrical interference. The traces, vias, and micro-vias composing the various layers of lower/rigid PCB stack-up 110 collect signals information from electrodes and contact pads formed on upper surface 111U (which interface both with sensors 121 and signals coming from sensors 151 by way of upper/flex PCB stack-up 140), and route them to one or more sensor control and data processing integrated circuit(s) 170 operably connected to input/output pads formed on lower surface 111L for digitization and optional processing to generate tactile information TI that is then forwarded to robotic controller 203 by way of data bus 108.

Figure 2A:
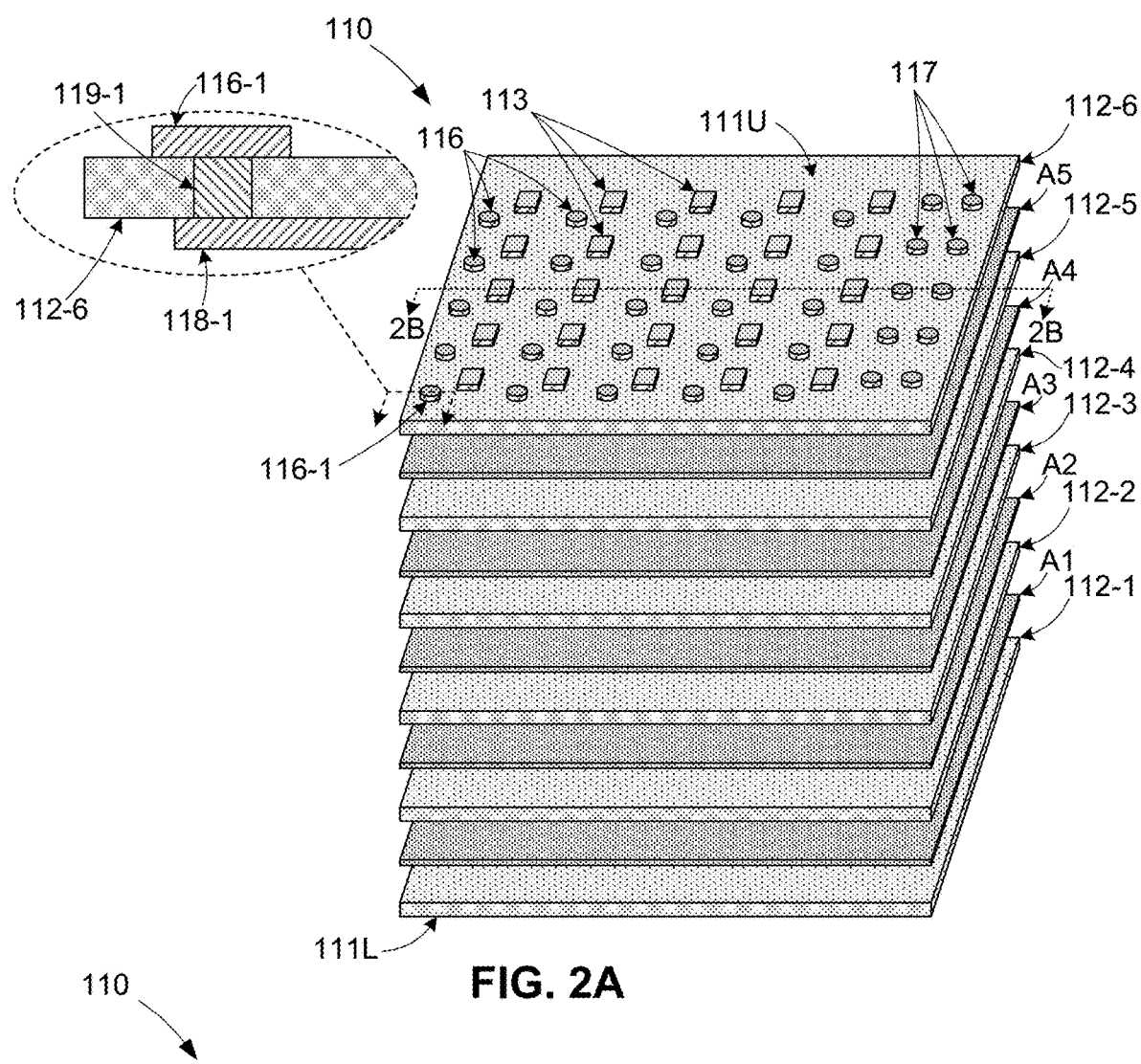
FIGS. 2A and 2B are exploded perspective and cross-sectional side views showing an exemplary lower/rigid PCB stack-up structure of the robotic system of FIG. 1.
Figure 2B:
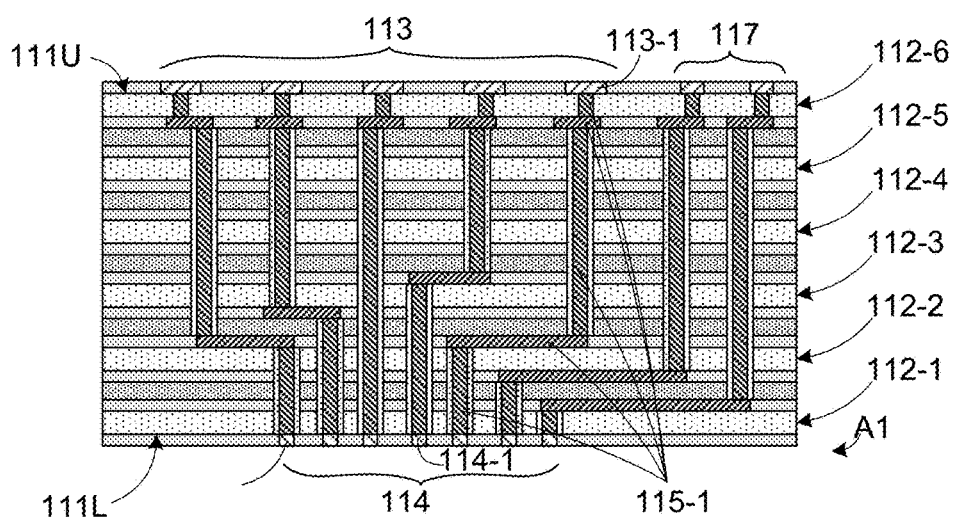

An exemplary lower/rigid PCB stack-up 110 is shown in the bubble section of FIG. 1 and in FIGS. 2A and 2B. Referring to FIG. 2A, lower/rigid PCB stack-up 110 includes six (first) substrates 112-1 to 112-6 arranged in a stacked configuration. Each substrate 112-1 to 112-6 comprises a layer of rigid insulating material (e.g., FR-4) having traces (e.g., patterned portions of a thin copper layer) formed on its upper and lower surfaces, and metal via structures (or micro-via structures) extending through the rigid insulating material layer to electrically connect associated traces formed on the opposing upper and lower substrate surfaces. For example, referring to FIG. 2A, uppermost substrate 112-6 is processed such that its upper surface includes multiple lower pressure (first) electrodes 113, sensor contact pads 116 and additional sensor contact pads 117, all of which being formed by corresponding metal (e.g., copper) islands disposed in a predetermined spaced-apart arrangement on uppermost surface 111U. Each lower pressure electrode 113, sensor contact pad 116 and additional sensor contact pad 117 is operably coupled to a corresponding signal path by way of metal via structures that extend downward through substrate 112-6. For example, the bubble portion of FIG. 2A shows a partial cross-section indicating that sensor contact pad 116-1 is connected to an associated copper trace 118-1 by way of via structure 119-1, which extends through an opening formed between the upper and lower surfaces of substrate 112-6. Once substrates 112-1 to 112-6 are processed in this manner, substrates 112-1 to 112-6 are fixedly interconnected using an established rigid PCB fabrication process (e.g., by way of intervening adhesive layers A-1 to A-5) to produce lower/rigid PCB stack-up 110. As indicated in FIGS. 1 and 2B, the interconnection process is performed such that upper substrate surface of uppermost substrate 112-6 forms an upper surface 111U of lower/rigid PCB stack-up 110, lower surface of lowermost substrate 112-1 forms a lower surface 111L of lower/rigid PCB stack-up 110, and each lower pressure electrode 113 and additional sensor contact pad 116 disposed on upper surface 111U is electrically connected to an associated input/output pad 114 formed on lower surface 111L by way of an associated signal path 115, with each signal path being formed by a contiguous (i.e., electrically-connected) series of electrically conductive structures (i.e., copper traces and metal via structures) that pass through substrates 112-1 to 112-6. For example, as indicated in FIG. 2B, lower pressure electrode 113 is electrically connected to associated input/output pad 114-1 by way of associated signal path 115-1, which is formed by the indicated set of contiguous traces and via structures that pass between upper surface 111U and lower surface 110 through substrates 112-1 to 112-6. Note that the signal paths depicted in FIG. 2B are arbitrarily formed for illustrative purposes and are not intended to represent an actual PCB stack-up configuration. In alternative embodiments lower/rigid PCB stack-up 110 may be produced using any number of rigid insulating material layers (first substrates).

Sensor arrays/layers 120 and 150 collectively include multimodal (i.e., various types of) sensors that are placed on or over upper surface 111U of lower/rigid PCB stack-up 110 in a manner that facilitates operable connection of each sensor to sensor control and data processing circuitry 170. In an exemplary embodiment, sensor arrays/layers 120 and 150 are disposed in respective horizontal planes, with lower (first) sensor array/layer 120 comprising sensors 121 disposed on upper surface 111U of the lower PCB stack-up 110, and upper (second) sensor array/layer 150 including additional (second) sensors 151 disposed on/over upper/flex PCB stack-up 140. That is, in the depicted exemplary embodiment, apparatus 100 includes sensors 121 disposed between lower/rigid PCB stack-up 110 and upper/flex PCB stack-up 140, and upper sensor array 150 disposed on upper surface 141U of the upper/flex PCB stack-up 140. In an alternative embodiment (not shown), lower array/layer may include one or more non-pressure sensors (e.g., a vibration/texture sensor, a proximity sensor or a temperature sensor) may be included with the pressure sensor array 120 (i.e., sandwiched between stack-ups 110 and 140). In another alternative embodiment (not shown), one or more additional layers of sensors may be implemented by way of adding one or more additional flexible PCB stack-up structures over upper/flex PCB stack-up 140.

According to a presently preferred embodiment, all sensors 121 forming the lower sensor array/layer 120 are pressure sensors, whereby sensor array/layer 120 is referred to below as pressure sensor array 120. Pressure sensors 121 are disposed in a symmetric (i.e., equally-spaced) two-dimensional arrangement, with each pressure sensor 121 being electrically connected (e.g., by way of solder-based connections) between an associated pressure electrode 113 disposed on lower/rigid PCB stack-up 110 and an associated upper pressure electrode 144 disposed on upper/flex PCB stack-up 140. For example, pressure sensor 121-1 has a lower terminal portion connected to associated lower pressure electrode 113-1 and an upper terminal portion connected to associated upper pressure electrode 144-1. xxx In the preferred embodiment each pressure sensor 121 is implemented using a piezoelectric sensor device (e.g., a piezoelectric material die comprising lead zirconate titanate (PZT) or other piezoelectric material). In other embodiments, pressure sensors 121 may be arranged in one of an asymmetric or random pattern arrangement on lower/rigid PCB stack-up 110, and each pressure sensor may be implemented using other piezo-type (e.g., a piezo-resistive) sensor device, or may be implemented using another pressure sensor type (e.g., strain gauge, capacitive pressure sensor or cavity-based pressure sensor). In yet other embodiments (not shown) the pressure sensors may be connected to electrodes formed on upper surface 111U or lower surface 141L (i.e., not sandwiched between two electrodes respectively disposed on the two stack-up structures as in the preferred embodiment), and lower sensor array/layer may include one or more non-pressure sensors.

Figure 3A:
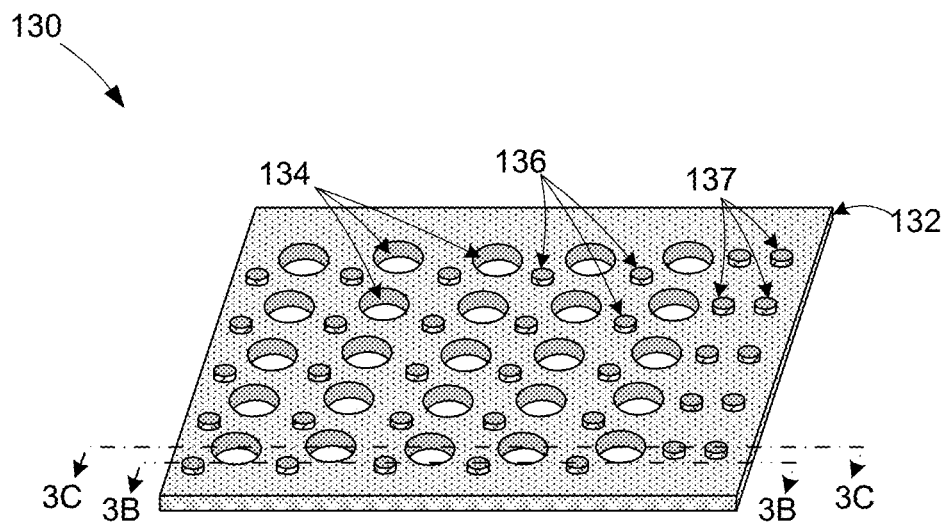
FIGS. 3A, 3B and 3C are exploded perspective and cross-sectional side views showing a simplified spacer structure of the robotic system of FIG. 1.
Figure 3B:
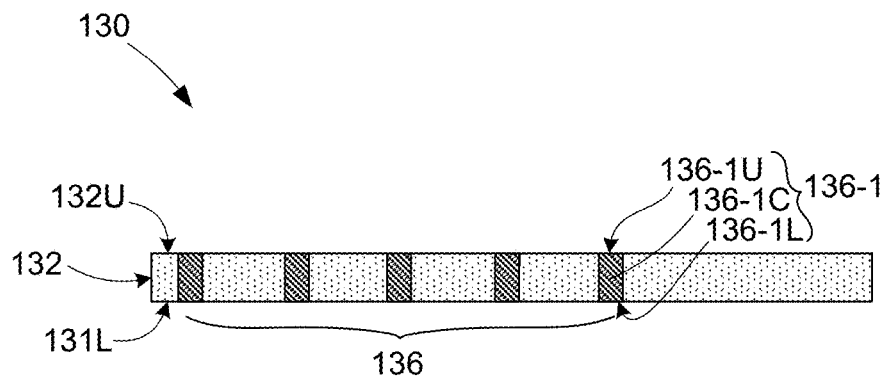
Figure 3C:
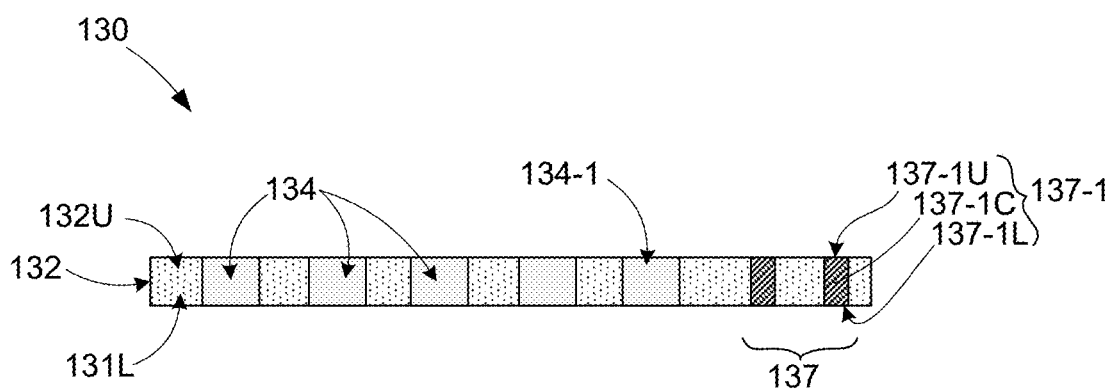

Referring again to the bubble section of FIG. 1 and to FIGS. 3A, 3B and 3C, an optional spacer structure 130 is disposed between upper surface 111U of lower/rigid PCB structure 110 and lower surface 141L of upper/flex PCB structure 140 to accommodate pressure array 120. FIGS. 3B and 3C are cross-sectional views respectively taken along lines 3B-3B and 3C-3C of FIG. 3A. Spacer structure 130 is optionally produced using either known rigid PCB fabrication and includes a rigid or flexible insulating material layer 132 or produced using known flexible PCB fabrication processes and includes a flexible insulating material layer 132. In either case, insulating material layer 132 that is processed to define multiple sensor openings 134 (i.e., openings that pass entirely through insulating material layer 132 from upper surface 131U to lower surface 131LA, and to include pressure sensor ground vias 136 and additional sensor vias 137, which are formed using a conductive material such as copper. As shown in FIGS. 3B and 3C, each pressure sensor ground via 136 and additional sensor via 137 forms an associated conductive path that passes entirely through insulating material layer 132. For example, as indicated in FIG. 3B, pressure sensor ground via 136-1 includes an upper portion 136-1U exposed on upper surface 132U, a lower portion 136-1L exposed on lower surface 132L, and a central portion 136-1C that forms a conductive path between upper portion 136-1U and lower portion 136-1L. Similarly, as shown in FIG. 3C, each additional sensor via 137-1 includes an upper portion 137-1U exposed on upper surface 132U, a lower portion 137-1L exposed on lower surface 132L, and a central portion 137-1C that forms a conductive path between upper portion 137-1U and lower portion 137-1L. As described below, when spacer structure 130 is mounted between PCB stack-up structures 110 and 140, each pressure sensor 121 is received within an associated sensor opening 134. With this configuration, spacer structure 130 provides two primary functions: first, spacer structure 130 acts as mechanical support for the placement of further layers above pressure sensor array 130 and to distribute pressure forces applied to upper/flex PCB stack-up 140 to prevent saturation and potential damage to pressure sensors 121, and second, spacer structure 130 provides electrical connections (i.e., by way of vias 136 and 137) between upper/flex PCB stack-up and input/output pads 114.

Figure 4A:
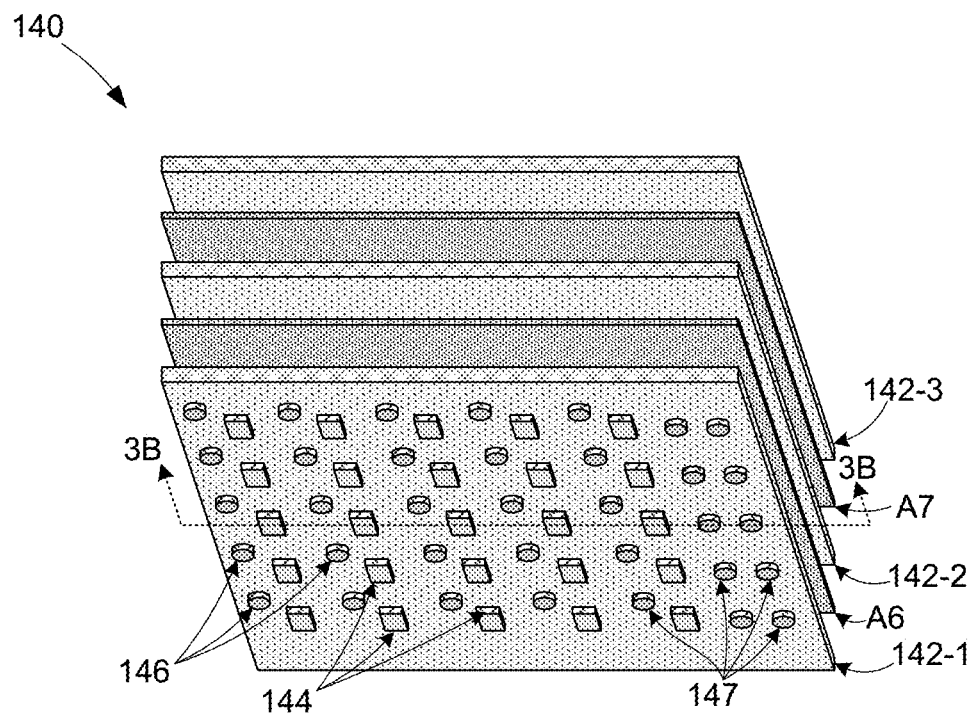
FIGS. 4A and 4B are exploded perspective and cross-sectional side views showing an exemplary upper/flex PCB stack-up structure of the robotic system of FIG. 1.
Figure 4B:
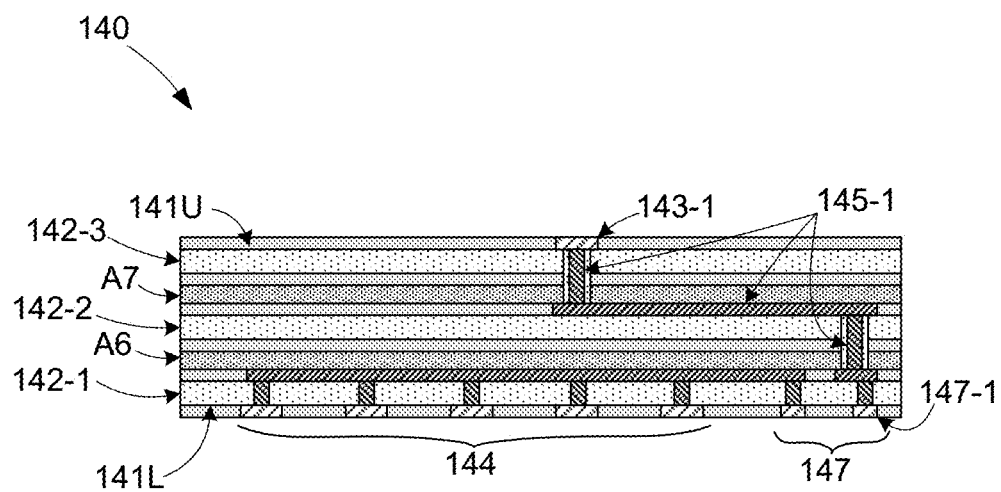

A simplified upper/flex PCB stack-up 140 is shown in the bubble section of FIG. 1 and in FIGS. 4A and 4B. Referring to FIG. 4A, upper/flex PCB stack-up 140 includes three substrates 142-1 to 142-3, with each substrate comprising a layer of flexible insulating material (e.g., polyimide) having associated copper traces formed on opposing surfaces and operably connected by metal via structures extending through the flexible insulating material. Substrates 142-1 to 142-3 are processed using known flexible PCB fabrication techniques such that the lower surface of lowermost substrate 142-1 includes multiple upper pressure (second) electrodes 143, sensor contact pads 146 and additional sensor contact pads 147 that are formed as described above and disposed in an arrangement that substantially mirrors the lower pressure electrodes 113, sensor contact pads 116 and additional sensor contact pads 117 formed on upper surface 111U of lower/rigid PCB stack-up 110 (described above). The upper surface of uppermost substrate 142-3, which forms upper layer 101U of apparatus 100, includes one or more additional sensor (third) electrodes 143 disposed in a predetermined arrangement, and each upper pressure electrode 144 and additional sensor electrode 143 is electrically connected to one or more associated additional sensor contact pads 147 by way of an associated signal path 145 in a manner similar to that described above with reference to signal paths 115 of lower/rigid PCB stack-up 110 (described above). For example, as indicated in the bubble portion of FIG. 1 and in FIG. 4B, additional sensor electrode 143-1 is electrically connected to associated additional sensor contact pad 147-1 by way of an associated signal path 145-1. Once processing is completed, substrates 142-1 to 142-3 are fixedly interconnected using an established flexible PCB fabrication process (e.g., by way of intervening adhesive layers A-6 and A-7) to complete the production of upper/flex PCB stack-up 140. As indicated in FIGS. 1 and 4B, the interconnection process is performed such that the upper substrate surface of uppermost substrate 142-3 forms an upper surface 141U of upper/flex PCB stack-up 140 and the lower surface of lowermost substrate 142-1 forms a lower surface 141L of upper/flex PCB stack-up 140.

In an alternative embodiment (not shown), an upper/flex PCB stack-up is formed using four or more flexible insulating material layers, with each layer composed of two flexible insulating material sheets having patterned copper on each (upper/lower) sheet surface. The bottom layer of the lowermost (first) sheet includes the upper pressure sensor electrodes that are soldered to the top contacts of the pressure sensors, and other contact pads that provide electrical connections to the various vias disposed on the underlying spacer structure. The top layer includes signal paths for routing signals to one or more intermediate sensors (e.g., a strain gauge), or may be used to serve as a multilayer flex-PCB ground layer or some combination of the two. The lower sheet of the upper layer is bonded to the lower layer via a lamination process or soldering process and serves as a shield electrode for capacitive proximity sensors or patterned to provide additional signal paths.

Referring again to the bubble section of FIG. 1, upper sensor array/layer 150 is disposed on upper layer 141U of upper/flex PCB stack-up 140 and includes one or more additional sensors 151, where each additional sensor 151 is of a sensor type different from pressure sensors (e.g., each additional sensor 151 comprises one of a vibration sensor, a proximity sensor and a temperature sensor). Each additional sensor 151 is electrically connected to associated additional sensor electrodes 143 disposed on upper/flex PCB stack-up 140, whereby control signals and data signals are transmitted between each additional sensor 151 and sensor control and data processing circuitry 170 by way of signal paths provided on PCB stack-up structures 110 and 140. For example, additional sensor 151-1 is electrically connected to associated additional sensor electrode 143-1, which is connected by way of (second) signal path 145-1 to additional sensor contact pad 147-1, which in turn is electrically connected to sensor control and data processing circuitry 170 by way of an associated signal path 115 provided on lower/fixed PCB stack-up structure 110 in the manner described below with reference to FIG. 5C. In one embodiment additional sensor 151-1 comprises one of a vibration/texture sensor (e.g., either piezoelectric/piezoresistive or MEMS-based sensor configured to detect vibrations), a proximity sensor (e.g., a capacitive-coupling-type sensing element) or a temperature sensor (e.g., a resistive temperature detector (RTD), a thermoelectric sensor, or other variants) configured to generate temperature data in response to a local temperature applied to a corresponding portion of apparatus 100. In other embodiments, at least one additional sensor 151 is a vibration/texture sensor, at least one additional sensor 151 is a proximity sensor, and at least one additional sensor 151 is a temperature sensor.

Referring to the upper portion of the bubble section of FIG. 1, flexible-rigid sensor apparatus 100-1 also includes an optional encapsulating layer 160 consisting essentially of a durable flexible material (e.g., silicone rubber) that is disposed on an uppermost surface 141U of upper/flex PCB stack-up 140. In one embodiment, encapsulating layer 160 is formed in accordance with specific material parameters that allow it to perform the protection and grasping friction functions described in co-owned and co-filed U.S. patent application Ser. No. 16/832,690 entitled "TACTILE PERCEPTION APPARATUS FOR ROBOTIC SYSTEMS", which is cited above.

Referring to the upper portion of the bubble section of FIG. 1, flexible-rigid sensor apparatus 100-1 also includes a sensor control and data processing circuitry 170 that is operably coupled (e.g., directly connected by way of solder-based connections or by way of a mezzanine connector as described below) to input/output pads 114, where sensor control and data processing circuitry 170 is configured to receive sensor data from sensors 121 and 151 by way of associated signal paths 115 and 145. For example, pressure sensor data SD-P1, which is generated by pressure sensor 121-1, is transmitted along an associated (first) signal path 115-1 disposed in the lower/rigid PCB stack-up structure 110 from associated lower pressure sensor electrode 113-1 to associated input/output pad 114-1, and from input/output pad 114-1 to an associated input terminal of sensor control and data processing circuitry 170. Similarly, temperature or other sensor data is transmitted from additional sensors 151 along an associated (second) signal paths 145 disposed in upper/flex PCB stack-up structure 140, then along associated additional sensor vias 137 disposed in spacer structure 130, then along associated (first) signal paths 115 disposed in lower/rigid PCB stack-up structure 110 to an associated input/output pad 114, from which it is transferred to an associated input terminal of sensor control and data processing circuitry 170.

FIGS. 5A to 5D depict a method for producing flexible-rigid sensor apparatus 100-1 according to a simplified exemplary embodiment.

Figure 5A:
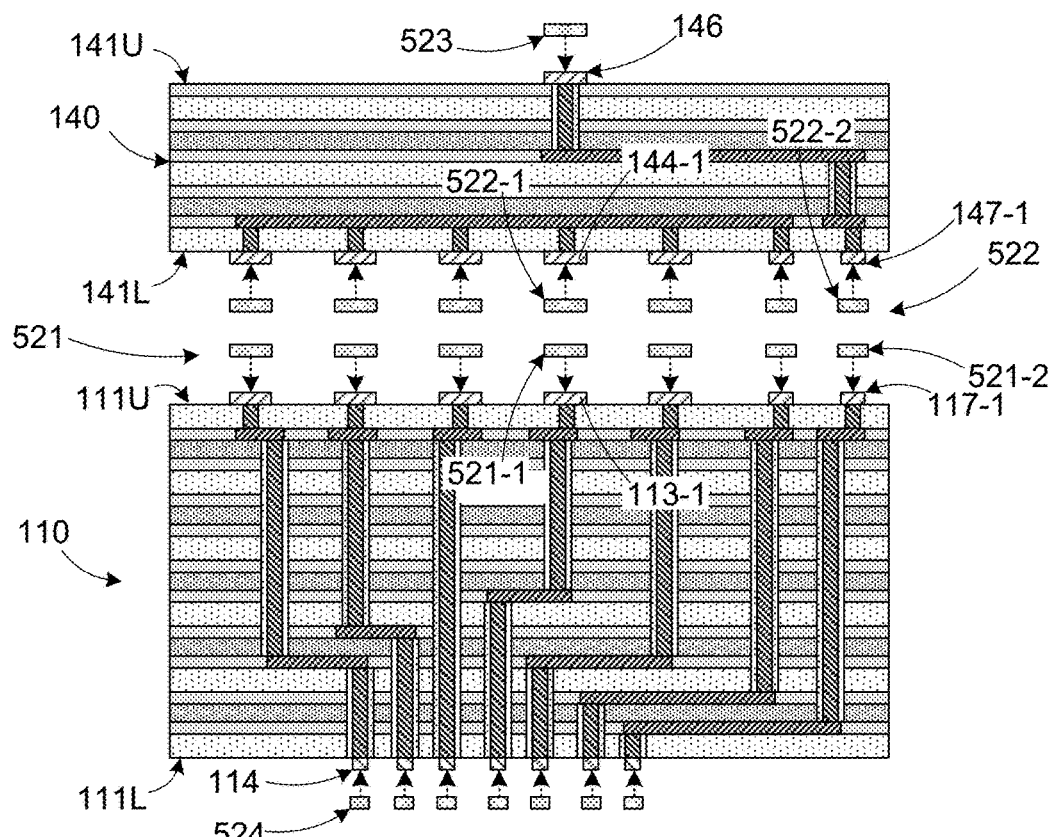
FIGS. 5A, 5B, 5C and 5D are side views showing a method for producing the flexible-rigid sensor apparatus of FIG. 1 according to another embodiment of the present invention.

FIG. 5A depicts lower/rigid PCB stack-up structure 110 and upper/flexible PCB stack-up structure 140 during an early stage of the production method. At this point lower/rigid PCB stack-up structure 110 is produced using the rigid PCB fabrication process described above with reference to FIGS. 2A and 2B, and upper/flexible PCB stack-up structure 140 is produced using the flexible PCB fabrication process described above with reference to FIGS. 4A and 4B. Although not shown, spacer structure 130 (see FIG. 5B) is also produced, for example, using the flexible PCB process utilized to provide upper/flexible PCB stack-up structure 140.

FIG. 5A also depicts applying solder flux (paste) portions to the I/O and contact pads and electrodes disposed on the upper/lower surfaces of lower/rigid PCB stack-up structure 110 and upper/flexible PCB stack-up structure 140. Specifically, first solder flux portions 521 are applied to each pressure sensor electrode and contact pad disposed on upper surface 111U of lower/rigid PCB stack-up structure 110, second solder flux portions 522 are applied to each pressure sensor electrode and contact pad disposed on lower surface 141L of upper/flexible PCB stack-up structure 140, third solder flux portions are applied to each additional sensor electrode 146 disposed on upper surface 141U of upper/flexible PCB stack-up structure 140, and optional fourth solder flux portions 524 are applied to each input/output pad 114 disposed on lower surface 111L. For example, first solder flux portions 521 and 522 are applied such that a first solder flux portion 521-1 is applied to pressure sensor electrode 113-1 and a second solder flux portion 522-1 is applied to pressure sensor electrode 144-1, and such that a first solder flux portion 521-2 is applied to additional sensor contact pad 117-1 and a second solder flux portion 522-2 is applied to contact pad 147-1.

Figure 5B:
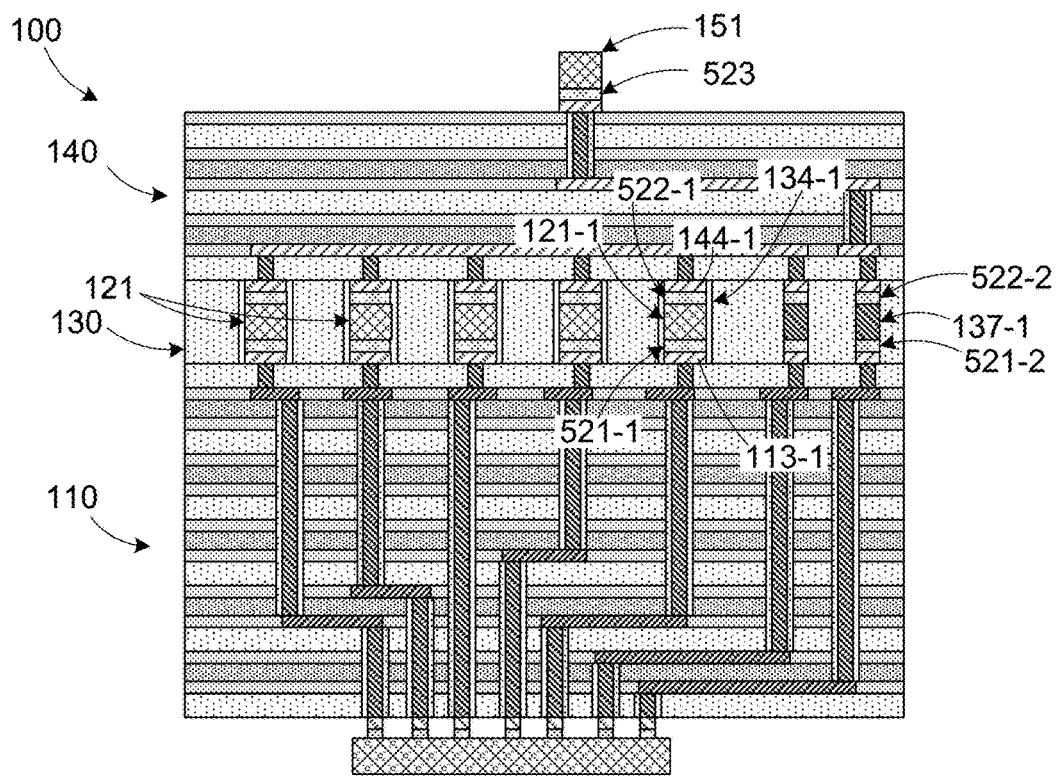

FIG. 5B depicts mounting piezoelectric-type pressure sensors 121 and additional sensors 151 such that each sensor contacts an associated solder flux portion. For example, pressure sensor 121-1 is mounted between lower/rigid PCB stack-up structure 110 and upper/flexible PCB stack-up structure 140 such that its lower surface/terminal contacts associated first solder flux portion 521-1, which is disposed on lower pressure sensor electrode 113-1, and such its upper surface/terminal contacts associated second solder flux portion 522-1, which is disposed on associated upper pressure sensor electrode 144-1. Note that each pressure sensor 121 is also received inside an associated sensor opening (e.g., sensor 121-1 is received inside sensor opening 134-1). Note also that spacer structure 130 is mounted such that via structures are similarly mounted between corresponding solder flux portions (e.g., additional sensor via 137-1 is disposed between solder portions 521-2 and 522-2), and that each additional sensor 151 is also mounted onto one or more solder flux portion 523.

Figure 5C:
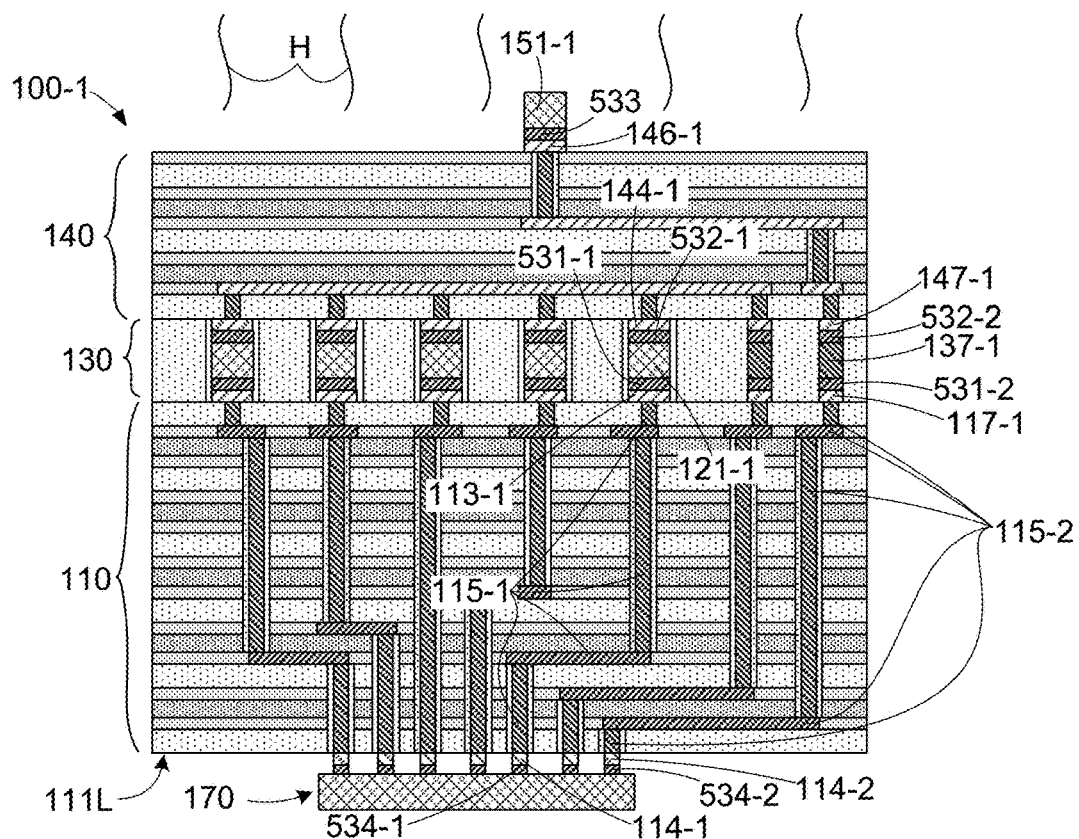

FIG. 5C depicts apparatus 100-1 during the performance of a solder reflow process that is utilized to form electrically conductive connections between associated electrodes, contact pads, sensors and other circuitry of the assembly described above with reference to FIG. 5B. The solder reflow process is performed in accordance with known techniques (e.g., by applying a suitable amount of heat energy H, indicated by wavy lines, to the assembled stack) such that each solder flux portion melts and forms a corresponding electrically conductive structure. For example, the reflow process melts the corresponding solder flux portion disposed between a lower end terminal of pressure sensor 121-1 and its associated lower pressure sensor electrode 113-1 and between the upper end terminal of pressure sensor 121-1 and its associated upper pressure sensor electrode 144-1, thereby forming a conductive connection 531-1 between a lower end of pressure sensor 121-1 associated lower pressure sensor electrode 113-1, and forming a conductive connection 531-2 between an upper end of pressure sensor 121-1 associated upper pressure sensor electrode 144-1. The reflow process also simultaneously melts all other solder flux portions, thereby forming a corresponding conductive connection 533 that secures additional sensor 151-1 to its associated additional sensor electrode 143-1 on upper surface 141U of upper/flexible PCB stack-up structure 140, and corresponding conductive connections that secure sensor control and data processing circuitry 170 to lower surface 111L of lower/rigid PCB stack-up structure 110 (e.g., conductive connections 534-1 and 534-2 respectively secure input/output pads 114-1 and 114-2 to corresponding input terminals of sensor control and data processing circuitry 170). Upon completion of the reflow process, electrical connections are established that facilitate the transmission of pressure and additional sensor data between sensor control and data processing circuitry 170 and all sensors disposed on apparatus 100. For example, pressure sensor data SD-P generated by pressure sensor 121-1 is transmitted along an associated (first) signal path 115-1 disposed in lower/rigid PCB stack-up structure 110 and through an associated input/output pad 114-1 and conductive connection 534-1 to an associated input terminal of sensor control and data processing circuitry 170. Similarly, additional (e.g., temperature, vibration, proximity or other) sensor data is transmitted from additional sensor 151-1 by way of conductive connection 533 and additional sensor electrode 146-1 to associated (second) signal path 145-1, along signal path 145-1 through upper/flex PCB stack-up structure 140 to upper additional sensor contact pad 147-1, then through spacer structure 130 by way of conductive connections 531-2 and 532-2 and additional sensor via 137-1 to lower additional sensor contact pad 117-1, then along associated (first) signal path 115-2 disposed in the lower/rigid PCB stack-up structure 110 and through associated input/output pad 114-2 and conductive structure 534-2 to an associated input terminal of sensor control and data processing circuitry 170. Sensor control and data processing circuitry 170 is thus operably coupled to receive multimodal (i.e., pressure and additional) sensor data from each pressure sensor and each additional sensor of apparatus 100-1 by way of corresponding input/output pads 114. In a presently preferred embodiment, sensor control and data processing circuitry 170 is configured to generate tactile information in response to this pressure and additional sensor data, and to interrupt primary control signal sequences (e.g., to correct offset conditions) in the manner described in co-owned and co-filed U.S. patent application Ser. No. 16/832,690, which is cited above.

Figure 5D:
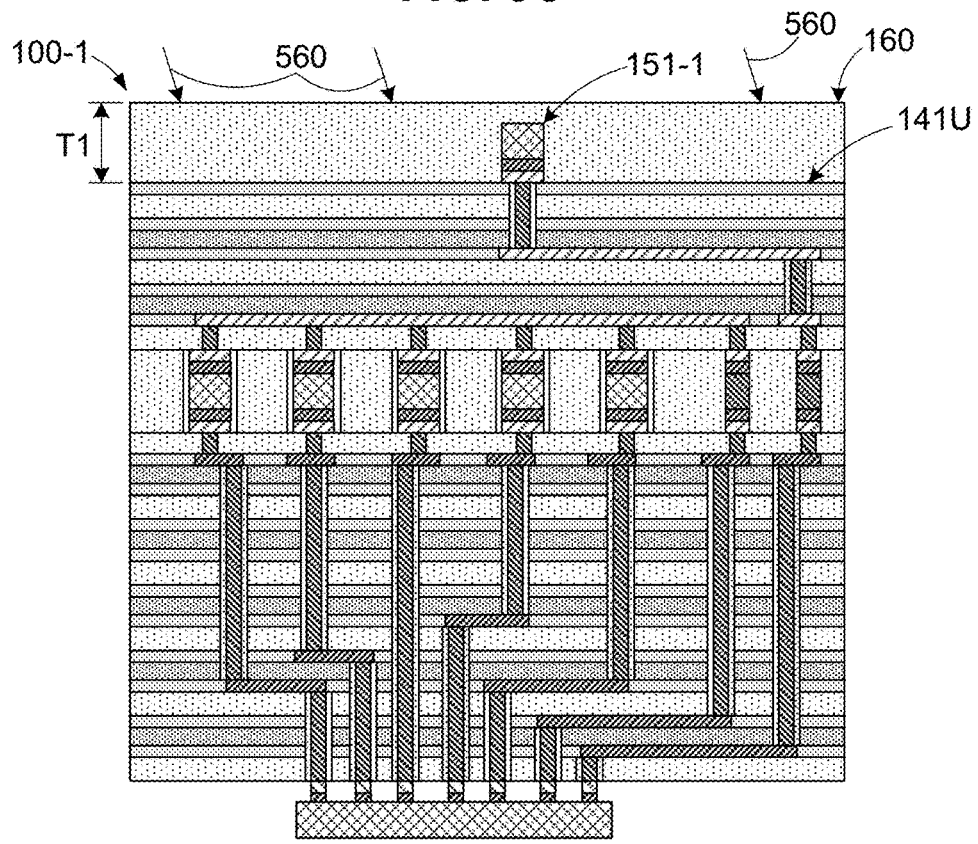

FIG. 5D depicts the deposition of optional encapsulating material 560 over upper surface 141U and additional sensor 151-1, thereby forming encapsulating layer 160 and completing the fabrication of rigid/flex sensor apparatus 100-1. In a presently preferred embodiment, encapsulating layer 160 is implemented using a layer of silicone rubber having a thickness T1 in the range of 0.5 mm to 10 mm and a material formulation characterized by having surface roughness from 0 to 300 microns RMS (root mean square) and a durometer of 30 A to 70 A. Additional features and benefits associated with encapsulating layer 160, along with techniques for collecting and utilizing sensor data indicative of slipping-type displacement of a target object relative to encapsulating layer 160, are described in co-owned and co-filed U.S. patent application Ser. No. 16/832,690, which is cited above.

Figure 6:
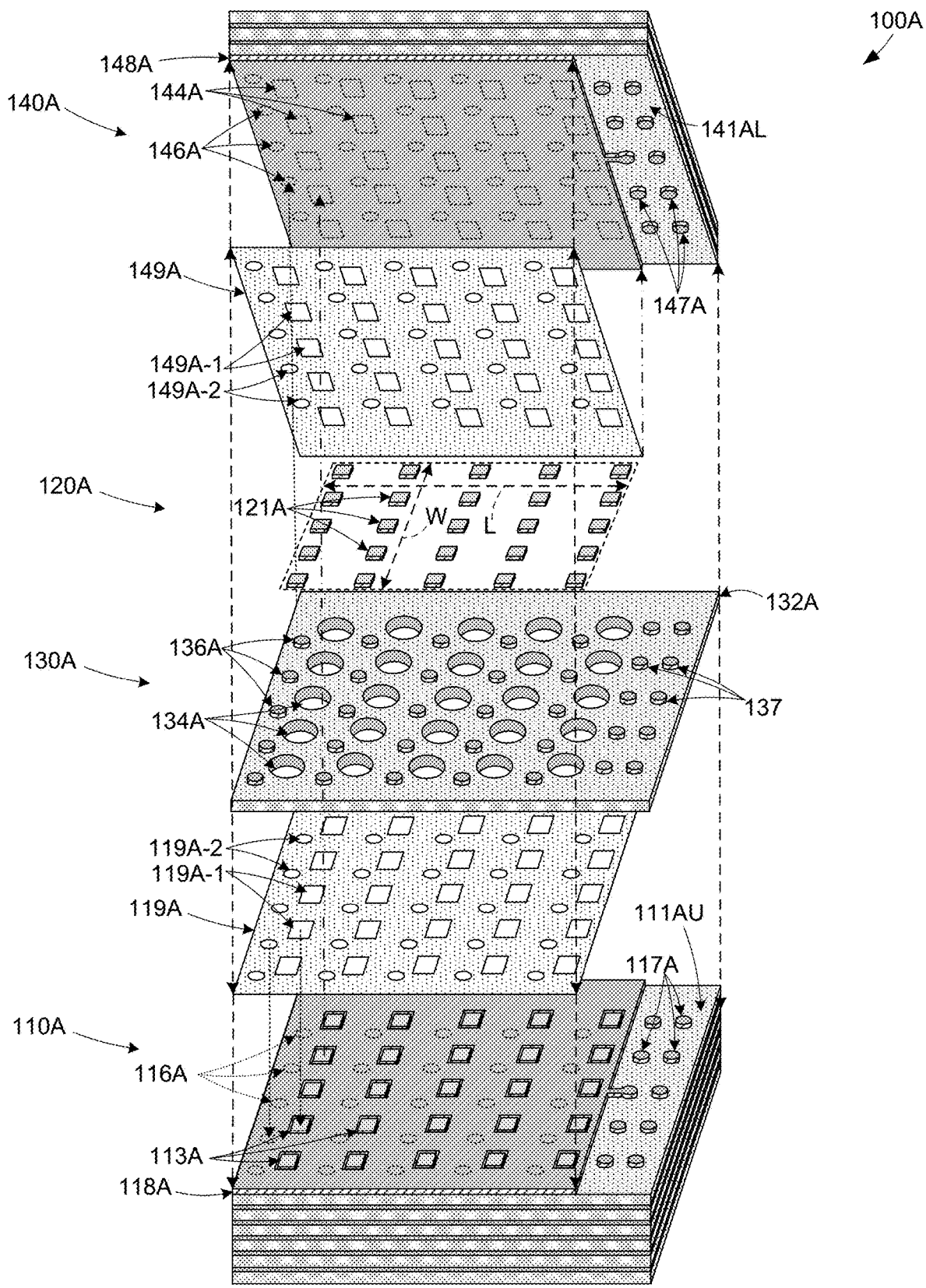
FIG. 6 is a modified exploded perspective view showing an apparatus according to an alternative embodiment of the present invention.
Figure 7A:
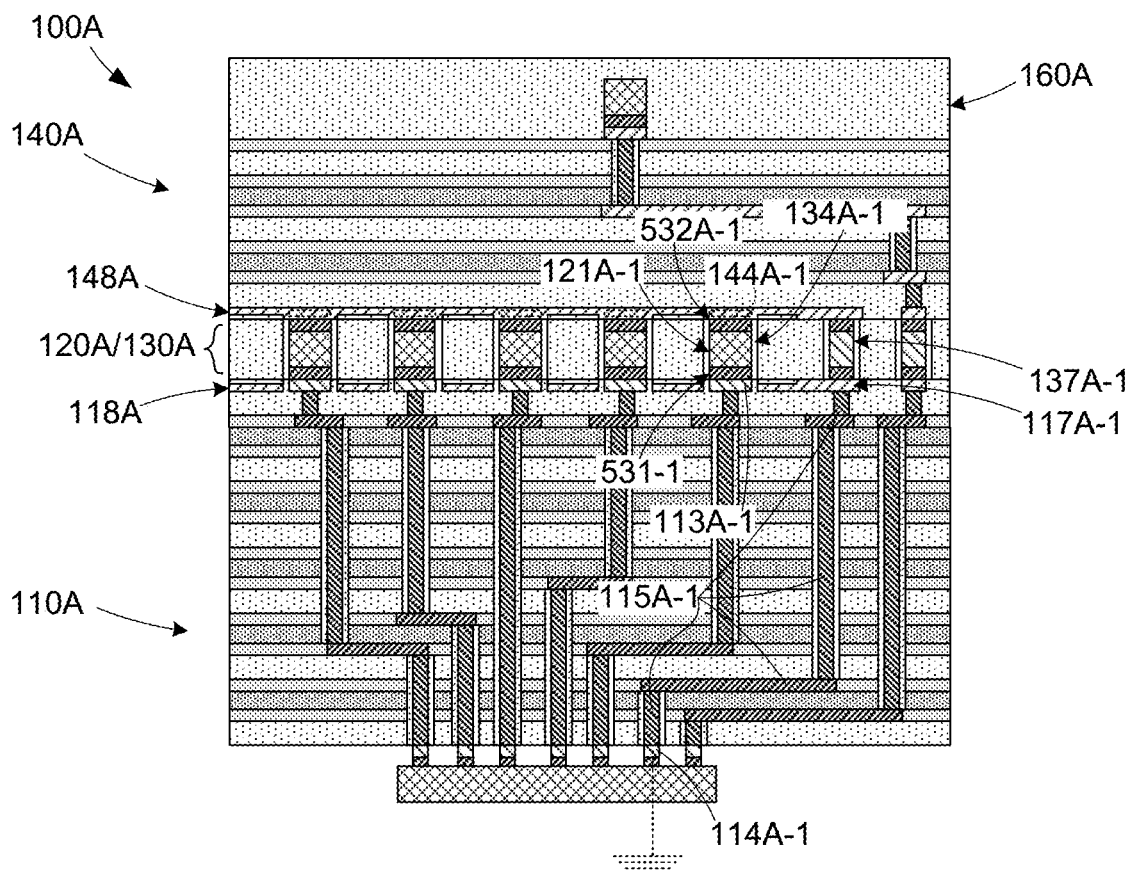
FIGS. 7A and 7B are cross-sectional side and partial cross-sectional side views, respectively, showing the rigid/flex sensor apparatus of FIG. 6 in an assembled state.
Figure 7B:
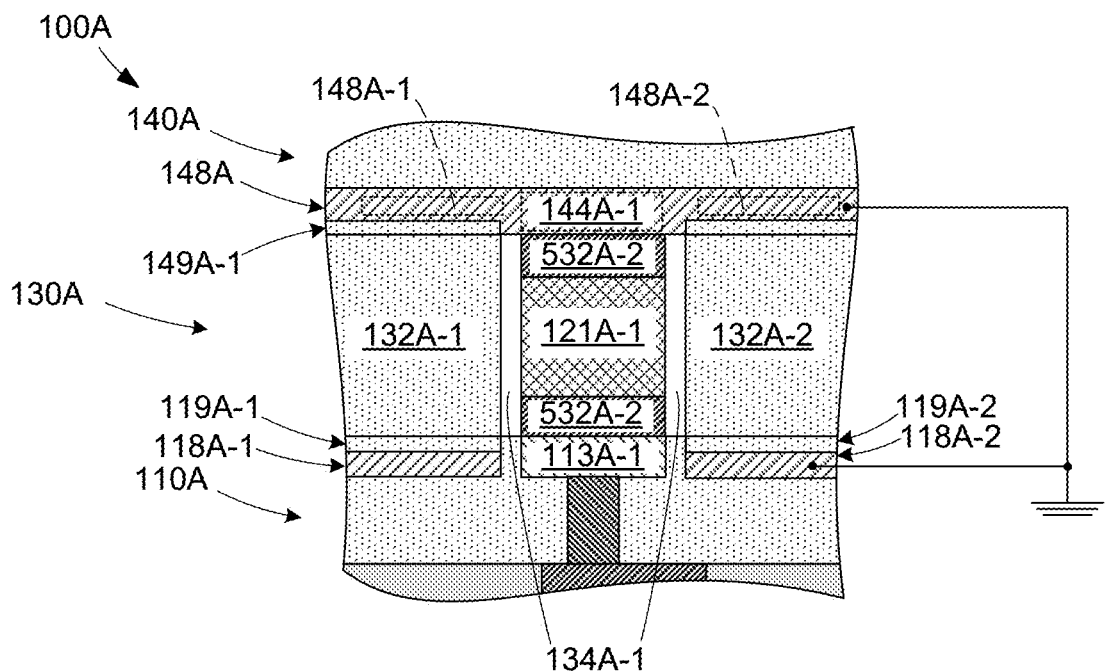

FIGS. 6, 7A and 7B depict a flex/rigid apparatus 100A according to a presently preferred embodiment in which one or more metal layers 118A and 148A are disposed on a lower/rigid PCB stack-up structure 110A and an upper/flex PCB stack-up structure 140A, respectively, and are utilized to form a Faraday cage that protects pressure sensors 121A from environmental interference. Referring to FIG. 6, apparatus 100A is similar to apparatus 100 (described above) in that it includes a spacer structure 130A and a pressure sensor array 120A disposed between lower/rigid PCB stack-up structure 110A and upper/flex PCB stack-up structure 140A. Other that the differences described below, lower/rigid PCB stack-up structure 110A, pressure sensor array 120A spacer structure 130A and upper/flex PCB stack-up structure 140A are configured and assembled as described above with reference to apparatus 100, and therefore associated details are omitted here for brevity.

Apparatus 100A differs from apparatus 100 in that at least a portion of insulating material layer 132A of spacer structure 130A is sandwiched between a first ground plane structure 118A and a second ground plane structure 148A that collectively form a Faraday cage around each pressure sensor 121A disposed inside each sensor opening 136A. Ground plane structures 118A and 148A are defined as contiguous layers of a conductive material (e.g., copper) that are respectively formed on lower/rigid PCB stack-up structure 110A and upper/flex PCB stack-up structure 140A and extend the entire length L and width W of sensor array 120A. In the depicted exemplary embodiment, ground plane structure 118A comprises a partial copper layer formed on upper surface 111AU that is patterned to provide peripheral spaces around (i.e., electrical isolation for) lower pressure sensor electrodes 113A, and is spaced from extra sensor electrodes 117A, but otherwise forms a continuous sheet-like ground plane structure. Similarly, ground plane structure 148A comprises a solid, unbroken copper layer formed on lower surface 141AL that is spaced from extra sensor electrodes 147A, but otherwise forms a continuous sheet-like ground plane structure. Note that respective portions of ground plane structure 118A are utilized to form lower sensor contact pads 116A, and that respective portions of ground plane structure 148A are utilized to form both upper pressure sensor electrodes 144A and upper sensor contact pads 146A.

Apparatus 100A also differs from apparatus 100 in that thin insulating layers 119A and 149A are respectively formed over ground plane layers 118A and 148A to ensure electrical isolation between adjacent sensors. Lower insulating layer 119A includes square openings 119A-1 that facilitate connections between lower pressure sensor electrodes 113A and lower portions of pressure sensors 121A and includes round openings 119A-2 that facilitate connections between lower sensor contact pads 116A and lower ends of corresponding via structures 136A. Similarly, upper insulating layer 149A includes square openings 149A-1 that facilitate connections between upper pressure sensor electrodes 144A and upper portions of pressure sensors 121A and includes round openings 149A-2 that facilitate connections between upper sensor contact pads 146A and upper ends of corresponding via structures 136A.

FIG. 7A is a cross-sectional side view showing flexible-rigid sensor apparatus 100A in an assembled state, and FIG. 7B is an enlarged partial section view showing portion of apparatus 100A that includes a pressure sensor 121A-1 in greater detail. FIG. 7A shows apparatus 100A after completion of an assembly process utilizing the various layers and structures shown in FIG. 6, where in one embodiment the assembly process is performed as described above with reference to FIGS. 5A to 5D and includes the formation of an encapsulating layer 160A over upper/flex PCB stack-up structure 140A. As indicated in FIG. 7A, both ground plane layers 118A and 148A are electrically connected together by way of at least one additional sensor contact pad 117A-1 and via structure 137A-1, which are coupled to a ground source, for example, by way of signal path 115A-1 and input/output contact pad 114A-1.

FIG. 7B shows a portion of apparatus 100A including a pressure sensor 121A-1 after completion of the assembly process performed as described above with reference to FIGS. 5A to 5D. As indicated in FIGS. 7A and 7B, spacer structure 130A is disposed between a lower/rigid PCB stack-up structure 110A and an upper/flex PCB stack-up structure 140A, and includes flexible insulating material layer 132A that defines a sensor opening 134A-1. For brevity, the portion of apparatus 100A depicted in FIG. 7B is limited to show only an upper portion of lower/rigid PCB stack-up structure 110A including lower pressure sensor electrode 113A-1, and to show a lower portion of upper/flex PCB stack-up structure 140A including upper pressure sensor electrode 144A-1. As described above with reference to FIG. 5C, pressure sensor 121A-1 is electrically connected to electrodes 113A-1 and 144A-1 by way of solder-based connection structures 532A-1 and 532A-2, respectively. During operation, ground plane layers 118A and 148A are connected to a ground source, whereby portions of ground plane layers 118A and 148A are operably configured to form a Faraday cage around each pressure sensor 121A. For example, portions 118A-1 and 118A-2 disposed adjacent to the lower end of pressure sensor 121A-1 and portions 148A-1 and 148A-2 disposed adjacent to the upper end of pressure sensor 121A-1 form a Faraday cage around pressure sensor 121A-1 disposed inside sensor opening 134A-1 defined through spacer structure 130A. In a similar manner, respective portions of ground plane layers 118A and 148A form Faraday cages around each pressure sensor 121A disposed inside each sensor opening 134A defined through spacer structure 130A. In this way, spacer structure 130A enhances the sensitivity of pressure sensor data generated by each pressure sensor (e.g., pressure sensor 121A-1), which further facilitates the use of PZT-type pressure sensor elements by protecting the very small signals generated by PZT dies from environmental interference.

FIGS. 8 to 10B depict a flexible-rigid sensor apparatus 100B according to another exemplary embodiment. As indicated in the upper portion of FIG. 8, apparatus 100B is similar to the embodiments described above in that it includes a pressure sensor array 120B and a spacer structure 130B disposed between a lower/rigid PCB stack-up structure 110B and an upper/flexible PCB stack-up structure 140B, with an upper sensor array 150B and an encapsulating layer 160B formed on/over upper/flexible PCB stack-up structure 140B, where each of these structures is formed in accordance with the embodiments described above.

Figure 8:
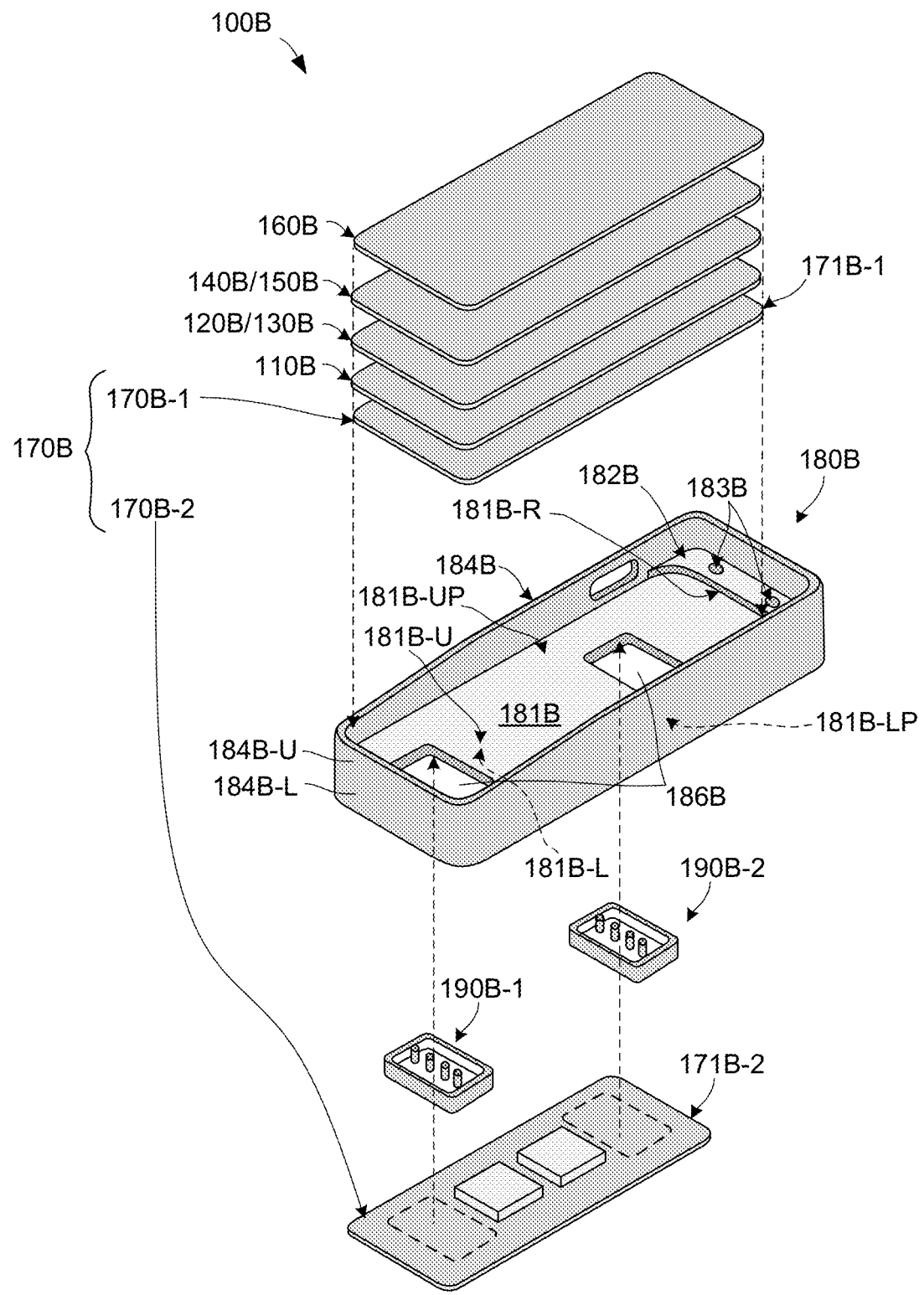
FIG. 8 is an exploded perspective view depicting a rigid/flex sensor apparatus according to another specific embodiment.

As indicated in the lower portion of FIG. 8, apparatus 100B differs from earlier-described embodiments in that apparatus 100B also includes a base structure 180B and a pair of mezzanine connectors 190B-1 and 190B-2, and further in that sensor control and data processing circuitry 170B includes a first circuit portion 170B-1 disposed on an upper (first) PCB structure 171B-1 that is directly connected to the lower/rigid PCB stack-up structure 110B, and a lower (second) circuit portion 170B-2 disposed on a separate (second) PCB structure 171B-2 that is operably coupled to first circuit portion 170B-1 by way of mezzanine connectors 190B-1 and 190B-2.

Base structure 180B comprises a machined or molded metal (e.g., aluminum or steel) structure including a support plate 181B having two through-openings 186B extending between a planar upper surface 181B-U and an opposing planar lower surface 181B-L, a mounting flange 182B integrally connected to a rear edge 181B-R of support plate 181B and including mounting holes 183B configured for rigid connection of base structure 181B to a robotic gripper (not shown), for example, by way of bolts or other fasteners (not shown). An integral peripheral wall 184B surrounds support plate 181B and mounting flange 182B and forms a protective housing that, in combination with encapsulation layer 160B, surrounds and protects lower (pressure) sensor array 120B and upper (additional) sensor array 150B. An upper wall portion 184E-U of peripheral wall 184B extends perpendicular to and upward from (above) support plate 181B-U, whereby upper support plate surface 181E-U and an inside surface of upper wall portion 184B-U form an upper pocket region 181B-UP configured to receive and secure upper (first) PCB structure 171B-1 and the other PCB and other structures of apparatus 100B that are depicted above base structure 180B in FIG. 8. Similarly, a lower wall portion 184B-L of peripheral wall 184B extends perpendicular to and downward from (below) support plate 181B-U, whereby lower support plate surface 181B-L and an inside surface of lower wall portion 184B-L form a lower pocket region 181B-LP configured to receive and secure lower PCB structure 171B-2.

Figure 9A:
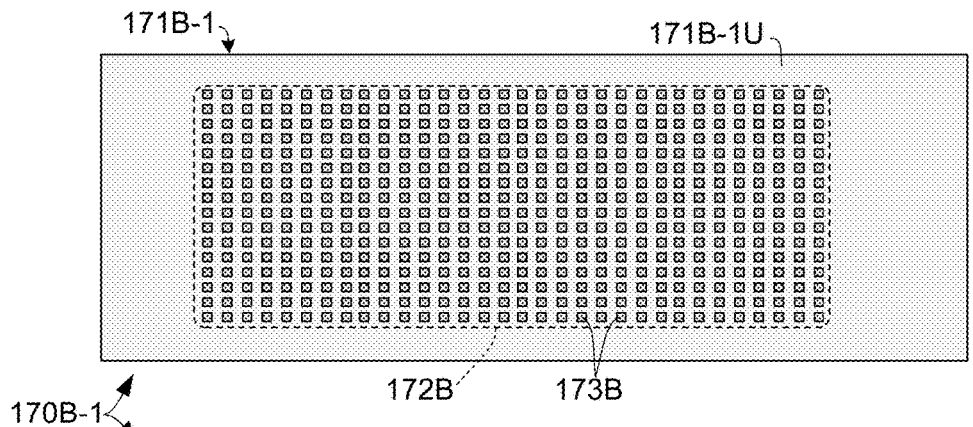
FIGS. 9A and 9B are top and bottom plan views, respectively, depicting a first portion of a sensor control and data processing circuitry of the rigid/flex sensor apparatus shown in FIG. 8.
Figure 9B:
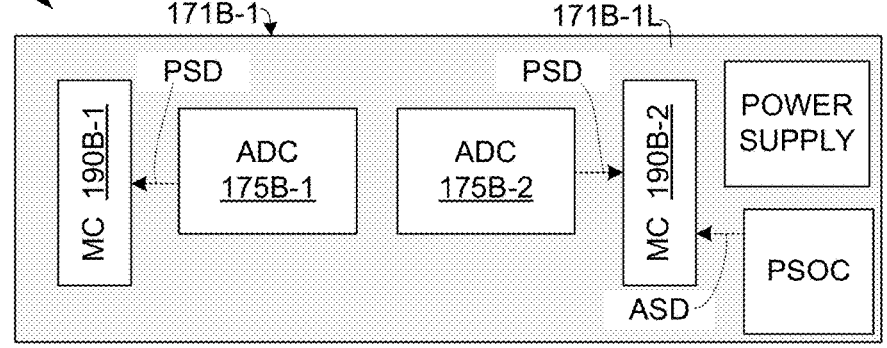
Figure 10A:
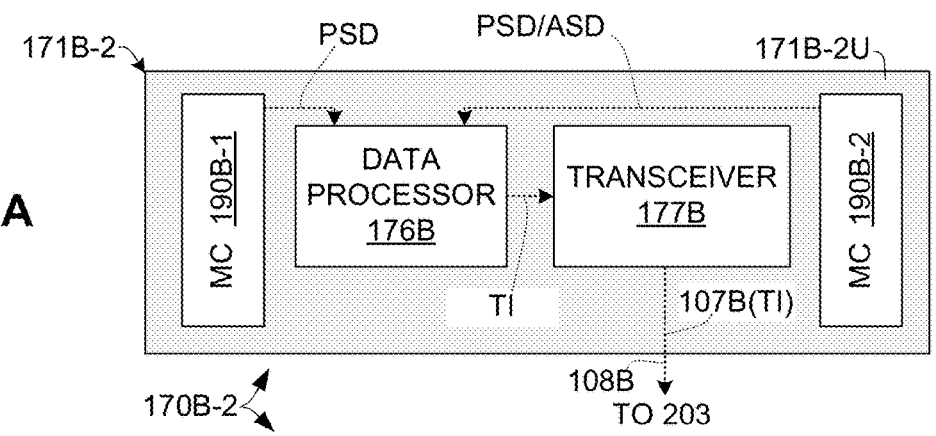
FIGS. 10A and 10B are top and bottom plan views, respectively, depicting second portion of a sensor control and data processing circuitry of the rigid/flex sensor apparatus shown in FIG. 8.
Figure 10B:
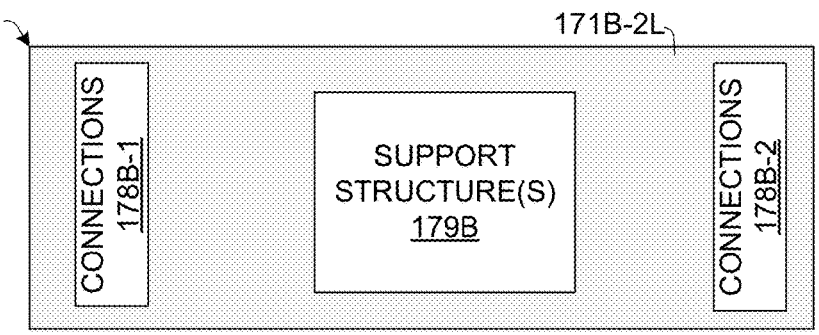

FIGS. 9A and 9B are top and bottom plan views, respectively, showing first circuit portion 170B-1, and FIGS. 10A and 10B are top and bottom plan views, respectively, showing second circuit portion 170B-2. Referring to FIG. 9A, circuit portion 170B-1 includes an array 172B including contact pads 173B that are disposed on an upper surface 171B-1U of upper PCB structure 171B-1, where contact pads 173B are arranged for solder-based connection to input/output pads (not shown) provided on a lower surface of lower/rigid PCB stack-up structure 110B (shown in FIG. 8). Referring to FIG. 9B, upper PCB structure 171B-1 includes signal paths and corresponding contact pads disposed on lower surface 171B-1L that facilitate the transfer of sensor data signals directly to analog-to-digital (ADC) circuits 175B-1 and 175B-2. In one embodiment, ADC circuit 175B-1 receives pressure sensor data from pressure sensor array 120B and transmits corresponding digital pressure sensor data signals PSD to a data processor 176B (see FIG. 10A) by way of mezzanine connector 190B-1, and ADC circuit 175B-2 receives additional sensor data from upper sensor array 150B and transmits corresponding digital additional sensor data signals ASD to data processor 176B by way of mezzanine connector 190B-2. Referring to FIG. 10A, data processor 176B is disposed on an upper surface 171B-2U of lower PCB structure 171B-2 and generates tactile information TI using one or more of a microprocessor, a programmable logic device (e.g., a field-programmable gate array (FPGA)), and a programmable-system-on-chip (PSOC) circuit. Tactile information TI is transmitted from data processor 176B to a transceiver circuit 177B, which retransmits tactile information TI as part of a feedback data signal 107B transmitted on a data bus 108B to system control circuit 203. In one embodiment, transceiver circuit 177B is implemented using a Universal Serial Bus (USB) circuit, and data bus 108B is implemented using a USB bus. FIG. 10B depicts a lower surface 171B-2L of lower PCB structure 171B-2, which in one embodiment includes optional connections 178B-1 and 178B-2 and one or more support structures 179B.

Referring again to FIG. 8, separating sensor control and data processing circuitry 170B into upper and lower portions 170B-1 and 170B-2 that are separated by rigid support plate 181B provides several benefits. First, rigid support plate 181B serves to absorb pressure forces, whereby this arrangement facilitates protecting sensor data processing circuit 176B and transceiver circuitry 177B from damage that may be caused by pressure forces generated by contact between apparatus 100B and target objects. Moreover, by configuring ADC circuits 175B-1 and 175B-2 to transmit digital sensor signals PSD and ASD using serial signal transmissions, this arrangement facilitates the use of a wide range of pressure sensor configurations (e.g., high resolution sensor arrays including a relatively large number of densely packed pressure sensors, or low resolution arrays including a relatively small number of pressure sensors) by facilitating the use of the same mezzanine connectors 190B-1 and 190B-2 to implement any of the sensor configurations.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with specific reference to articulated-type robotic systems that use two-finger end effectors, the rigid/flex sensor apparatus disclosed herein may also be beneficially utilized in advanced robotic systems that utilize three, four or five finger end effectors (e.g., human-like robotic hands), and may be integrated into a gripper-type end effector using any of the details provided in co-owned and co-filed U.S. patent application Ser. No. 16/832,800 entitled "ROBOTIC GRIPPER WITH INTEGRATED TACTILE SENSOR ARRAYS", all of which being incorporated herein by reference in its entirety. Moreover, although the present invention is described with reference to single lower/flex PCB stack-up structure, two or more lower/flex PCB stack-up structures may be utilized to provide additional sensor layers without departing from the spirit of the invention.

The invention claimed is:

1. An apparatus configured for fixed connection to an end effector of a robotic system and configured to provide sensor data derived from a target object to a control circuit of the robotic system when the robotic system causes the apparatus to operably interact with the target object, said apparatus comprising:
   a first printed circuit board (PCB) structure having an upper surface and an opposing lower surface, the first PCB structure including:
      a plurality of first substrates fixedly interconnected in a stacked arrangement, each of said first substrate comprising a rigid insulating material,
      a plurality of first electrodes disposed on the upper surface and a plurality of input/output pads disposed on the lower surface;
      a plurality of first signal paths, each said first signal path comprising contiguous conductive structures extending from an associated said first electrode to an associated said input/output pad;
   a pressure sensor array including a plurality of pressure sensors; and
   a second PCB structure having a second upper surface and an opposing second lower surface, the second PCB structure including:
      a plurality of second substrates fixedly interconnected in a stack arrangement, each said second substrate comprising a flexible insulating material, and
      a plurality of second electrodes disposed on the lower surface,
   wherein the pressure sensor array is sandwiched between said first and second PCB structures such that each said pressure sensor is electrically connected between an associated said first electrode and an associated said second electrode.

2. The apparatus of claim 1,
   wherein the rigid insulating material comprises one of a glass-epoxy material, ceramic, plastic and insulated metal, and
   wherein the flexible insulating material comprises one of polyimide and polyethylene terephthalate.

3. The apparatus of claim 2,
   wherein each of said plurality of pressure sensors comprises one of a strain gauge, a capacitive pressure sensor, a cavity-based pressure sensor, a piezoelectric sensor and a piezoresistive sensor, and wherein said plurality of pressure sensors are disposed in one of a symmetric arrangement, an asymmetric arrangement and a random pattern arrangement.

4. The apparatus of claim 1, further comprising a spacer structure disposed between the upper surface of the first PCB structure and the lower surface of the second PCB structure, said spacer structure comprising one or more insulating material layers defining a plurality of sensor openings, wherein each said pressure sensor is disposed inside an associated said sensor opening.

5. The apparatus of claim 4, wherein at least a portion of the one or more insulating material layers of the spacer structure is sandwiched between first and second ground plane structures that are operably configured to form a Faraday cage around said each pressure sensor disposed inside said each associated sensor opening.

6. The apparatus of claim 1,
wherein said second PCB structure further comprises a plurality of first contact pads and a plurality of second contact pads disposed on the second lower surface, a plurality of third electrodes disposed on the second upper surface, and a plurality of second signal paths, each said second signal path comprising second contiguous conductive structures extending between an associated said second contact pad and one of an associated first contact pad and an associated said third electrode, and
wherein said apparatus further comprises one or more second additional sensors disposed on the second upper surface of the second upper/flex PCB structure such that each of said one or more second sensors is electrically connected to at least one associated said third electrode.

7. The apparatus of claim 6, wherein each said one or more second additional sensors comprises one of a vibration sensor, a proximity sensor and a temperature sensor.

8. The apparatus of claim 7, further comprising a encapsulating layer disposed on the second upper surface of the second PCB structure, said encapsulating layer consisting of a flexible material that elastically deforms in response to said contact force applied by said target object onto the second PCB structure during said operable interaction.

9. The apparatus of claim 1, further comprising sensor control and data processing circuitry coupled to the input/output pads such that said sensor control and data processing circuitry is operably coupled to receive each said pressure sensor by way of an associated said first signal path.

10. The apparatus of claim 9, wherein the sensor control and data processing circuitry comprises at least one of an analog-to-digital converter (ADC) circuit that is operably configured to convert analog pressure sensor data values respectively generated by said plurality of pressure sensors into corresponding digital pressure sensor values, a sensor data processing circuit configured to generate tactile information in response to said digital pressure sensor values, and a transceiver circuit configured to transmit said tactile information to the control circuit.

11. The apparatus of claim 1, further comprising a encapsulating layer disposed on the second upper surface of the second PCB structure, said encapsulating layer consisting of a flexible material that elastically deforms in response to said contact force applied by said target object onto the second PCB structure during said operable interaction.

12. The apparatus of claim 1, further comprising sensor control and data processing circuitry operably coupled to the input/output pads such that said sensor control and data processing circuitry is coupled to each said pressure sensor by way of at least one associated said first signal path.

13. An apparatus configured for fixed connection to an end effector of a robotic system and configured to provide multi-modal sensor data derived from a target object to a control circuit of the robotic system when the robotic system causes the apparatus to operably interact with the target object, said apparatus comprising:
a first printed circuit board (PCB) structure having a first upper surface and an opposing first lower surface, the first PCB structure including a plurality of first substrates fixedly interconnected in a stack arrangement, each of said first substrate comprising a rigid insulating material, said first PCB structure also including a plurality of first electrodes and a plurality of first contact pads disposed on the first upper surface, a plurality of input/output pads disposed on the first lower surface, and a plurality of first signal paths, each said first signal path comprising contiguous conductive structures extending between an associated said input/output pad and one of an associated said first electrode and an associated said first contact pad;
a second printed circuit board (PCB) structure having a second upper surface and an opposing second lower surface, the second PCB structure including a plurality of second substrates fixedly interconnected in a stack arrangement, each said second substrate comprising a flexible insulating material, said second PCB structure also including a plurality of second electrodes and a plurality of second contact pads disposed on the second lower surface, a plurality of third electrodes disposed on the second upper surface, and a plurality of second signal paths, each said second signal path comprising second contiguous conductive structures extending from an associated said second contact pad to one of an associated said second electrode and an associated said third electrode;
one or more first sensors disposed between said first and second PCB structures such that each said first sensor is electrically connected to at least one associated said first electrode;
one or more second sensors disposed on the second upper surface of the second PCB structure, each said additional sensor being electrically connected to at least one said third electrode; and
sensor control and data processing circuitry operably coupled to the input/output pads and configured to receive said multimodal sensor data from said first and second sensors by way of said first and second signal paths.

14. The apparatus of claim 13,
wherein the rigid insulating material comprises one of a glass-epoxy material, ceramic, plastic and insulated metal, and
wherein the flexible insulating material comprises one of polyimide and polyethylene terephthalate.

15. The apparatus of claim 13,
wherein each of said plurality of first sensors comprises one of a strain gauge-type pressure sensor, a capacitive pressure sensor, a cavity-based pressure sensor, a piezoelectric sensor and a piezoresistive sensor, and
wherein each of said plurality of second sensors comprises one of a vibration sensor, a proximity sensor and a temperature sensor.

16. The apparatus of claim 13, further comprising a spacer structure disposed between the first upper surface of the first PCB structure and the second lower surface of the second PCB structure, said spacer structure comprising one or more insulating material layers defining a plurality of sensor openings, wherein each said first sensor is disposed inside an associated said sensor opening.

17. The apparatus of claim 16, wherein said spacer structure further comprise one or more metal layers disposed on said one or more insulating material layers and operably configured to form a Faraday cage around each of said plurality of sensor openings.

18. The apparatus of claim 13, wherein the sensor control and data processing circuitry comprises at least one of an analog-to-digital converter (ADC) circuit that is operably configured to convert analog pressure sensor data values respectively generated by said plurality of pressure sensors into corresponding digital pressure sensor values, a sensor data processing circuit configured to generate tactile information in response to said digital pressure sensor values, and a transceiver circuit configured to transmit said tactile information to the control circuit.

19. A method for producing a flexible-rigid sensor apparatus configured for fixed connection to an end effector of a robotic system and configured to provide sensor data derived from a target object for use by a control circuit of the robotic system when the robotic system causes the flexible-rigid sensor apparatus to operably interact with the target object, said method comprising:

utilizing a rigid printed circuit board (PCB) fabrication process to produce a first printed circuit board (PCB) structure having a plurality of first sensor electrodes and utilizing a flexible PCB fabrication process to produce a second PCB structure having a plurality of second sensor electrodes;

applying solder flux portions to said first and second PCB structures such that a first solder flux portion is applied to each said first pressure sensor electrodes and a second solder flux portion is applied to each said second pressure sensor electrode;

mounting a plurality of piezoelectric-type pressure sensors between the first and second PCB structures such that a lower surface of each pressure sensor contacts an associated first said solder flux portion, and such that an upper surface of said each pressure sensor contacts an associated said second solder flux portion; and performing a solder reflow process such that each said first and second solder flux portion forms a conductive connection between said pressure sensor and each of said associated lower pressure sensor electrode and said associated upper pressure sensor electrode.

20. The method of claim 19, further comprising utilizing said flexible PCB fabrication process to produce a spacer structure comprising one or more insulating material layers defining a plurality of sensor openings, wherein said mounting further comprises disposing said spacer between the upper surface of the first PCB structure and the lower surface of the second PCB structure such that each said pressure sensor is disposed inside an associated said sensor opening.

* * * * *